(12) United States Patent
Yamamoto et al.

(10) Patent No.: US 7,801,194 B2
(45) Date of Patent: Sep. 21, 2010

(54) SEMICONDUCTOR LASER DEVICE AND OPTICAL DISK UNIT USING THE SAME

(75) Inventors: Kei Yamamoto, Nara (JP); Ken Ohbayashi, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 1193 days.

(21) Appl. No.: 10/608,776

(22) Filed: Jun. 30, 2003

(65) Prior Publication Data

US 2004/0066818 A1    Apr. 8, 2004

(30) Foreign Application Priority Data

Jul. 1, 2002    (JP) .............................. 2002-192387
Jul. 18, 2002   (JP) .............................. 2002-209795

(51) Int. Cl.
*H01S 5/00*    (2006.01)
(52) U.S. Cl. ................. 372/43.01; 372/45.01; 372/50.1
(58) Field of Classification Search .......... 372/43–50.1, 372/50.121
See application file for complete search history.

(56) References Cited

U.S. PATENT DOCUMENTS

| | | | | |
|---|---|---|---|---|
| 4,794,611 | A * | 12/1988 | Hara et al. ..................... | 372/45 |
| 5,075,743 | A * | 12/1991 | Behfar-Rad .................. | 257/97 |
| 5,222,090 | A * | 6/1993 | Serreze ......................... | 372/45 |
| 5,313,073 | A * | 5/1994 | Kuroda et al. ................. | 257/18 |
| 5,661,741 | A * | 8/1997 | Kakimoto ................. | 372/50.22 |
| 5,832,018 | A * | 11/1998 | Ohkubo ................. | 372/45.011 |
| 5,937,273 | A * | 8/1999 | Fujii et al. .................... | 438/46 |
| 6,028,874 | A | 2/2000 | Wada | |
| 6,127,691 | A * | 10/2000 | Fukunaga et al. ............. | 257/17 |
| 6,167,072 | A * | 12/2000 | Zory, Jr. ....................... | 372/46 |
| 6,181,721 | B1 * | 1/2001 | Geels et al. .............. | 372/45.01 |
| 6,396,863 | B1 * | 5/2002 | Fukunaga ................ | 372/46.01 |
| 6,516,016 | B1 | 2/2003 | Fukunaga | |
| 6,580,738 | B2 * | 6/2003 | Fukunaga ................ | 372/46.01 |
| 6,670,643 | B2 * | 12/2003 | Hirukawa .................... | 257/79 |
| 6,798,808 | B1 * | 9/2004 | Konushi et al. ........ | 372/45.013 |
| 6,813,299 | B2 * | 11/2004 | Kawanishi et al. ....... | 372/45.01 |
| 6,841,409 | B2 * | 1/2005 | Onishi ......................... | 438/37 |

(Continued)

FOREIGN PATENT DOCUMENTS

JP    5-75210    3/1993

(Continued)

OTHER PUBLICATIONS

Oxford Dictionary of Physics, Fourth Edition, 1999, p. 256.*

(Continued)

*Primary Examiner*—Minsun Harvey
*Assistant Examiner*—Delma R Forde
(74) *Attorney, Agent, or Firm*—Morrison & Foerster LLP

(57) ABSTRACT

In a semiconductor laser device having an oscillation wavelength larger than 760 nm and smaller than 800 nm, at least a lower clad layer, a lower guide layer, an active region, an upper guide layer and an upper clad layer are supported by a GaAs substrate, the active region having a quantum well structure in which one or more well layers and barrier layers are stacked. The one or more well layers and the barrier layers are formed of any one of InGaP, InGaAsP and GaAsP, and the upper and/or lower guide layer is formed of $Al_zGa_{1-z}As$ ($0.20 < z \leq 1$).

22 Claims, 12 Drawing Sheets

U.S. PATENT DOCUMENTS

| | | | | |
|---|---|---|---|---|
| 6,853,661 | B2* | 2/2005 | Ekawa | 372/43 |
| 2001/0017871 | A1 | 8/2001 | Fukunaga | |
| 2003/0016712 | A1* | 1/2003 | Matsumoto | 372/45 |
| 2003/0059969 | A1* | 3/2003 | Minato et al. | 438/22 |
| 2003/0122134 | A1* | 7/2003 | Hirukawa | 257/79 |

FOREIGN PATENT DOCUMENTS

| | | |
|---|---|---|
| JP | 10-32364 | 2/1998 |
| JP | 10-107369 | 4/1998 |
| JP | 11-97794 | 4/1999 |
| JP | 11-220224 | 8/1999 |
| JP | 2001-15863 | 1/2001 |
| JP | 2001-168458 | 6/2001 |
| JP | 2001-223436 | 8/2001 |
| JP | 2004-14819 | 1/2004 |
| WO | WO 03/043151 A1 | 5/2003 |

OTHER PUBLICATIONS

Andrea Oster et al. "Gain spectra measurement of strained and strain-compensated InGaAsP-AlGaAs Laser for $\lambda \approx 800$ nm" iEEE Journal of Selected Topic in Quantum Elevtronics, vol. 5, No. 3, May/Jun. 1999, pp. 631-636.*

H.Takiguchi et al. "720-780NM AlGaAs/GaAs DFB Laser with InGaAsP Waveguide Layers" Optoelectro, Technol. Res. Corp. c/o Sharp Corp, Central Res. Labs. IEEE, 1987 pp. 788-797—IEDM 87.*

Markos Galarza et al. "Compact AHDN Hisghly-Efficient Polarization Independent Vertical Resonat Couples for Active-Passive Monotilithic Integration" Jun. 9, 2008/ vol. 16, No. 12/ Opticecs Express pp. 8350-8358.*

Toshiaki Fukunaga et al., High-Power 0.8 UM INGAASP/INGAP/ AIGAS Single Quantum Well Lasers With Tensile-Strained INGAP Barriers—Part 2, No. 4A, Apr. 1, 1999, pp. L387-L389.

* cited by examiner

SEMICONDUCTOR LASER DEVICE AND OPTICAL DISK UNIT USING THE SAME

BACKGROUND OF THE INVENTION

The present invention relates to a semiconductor laser device which contains no Al in its active region and whose oscillation wavelength is in a 780 nm band (i.e., larger than 760 nm and smaller than 800 nm). The invention also relates to an optical disk unit using the semiconductor laser device.

Semiconductor laser devices of the 780 nm band have been widely used as semiconductor laser devices for reproducing discs such as CDs (Compact Disks) and MDs (Mini Disks). Among others, a semiconductor laser device which exhibits high reliability even with 120 mW or higher power is keenly desired as a semiconductor laser device for use with CD-Rs (CD-Recordable's) capable of high-speed writing.

In the case of a conventional AlGaAs quantum well structure in which Al is contained in well layers and barrier layers, there is an issue that the reliability particularly at high temperatures or high power deteriorates. The reason of this is considered that Al, being an active substance, would react even with a trace quantity of impurities such as oxygen, thereby amplifying the deterioration of the material. A countermeasure for this could be that high power and high reliability are implemented by providing a structure in which Al is not contained in the well layer/barrier layer. However, actually, there has not yet been developed a semiconductor laser device that has enough reliability with 120 mW or higher power at the 780 nm band.

As semiconductor laser devices of an oscillation wavelength of 810 nm with a structure in which Al is not contained in the well layer/barrier layer, there have been proposed those disclosed in Japanese Patent Laid-Open Publication HEI 11-220224 and Japanese Journal of Applied Physics Vol. 38 (1999) pp. L387-L389.

SUMMARY OF THE INVENTION

Based on this prior art, we made a semiconductor laser device which would oscillate at 780 nm.

FIG. 16 is a structural view showing a semiconductor laser device of an InGaAsP-based quantum well structure in which no Al is contained in the well layers nor in barrier layers. FIG. 17 is a diagram of energy band gap (Eg) in the vicinity of the active region in the semiconductor laser device shown in FIG. 16.

FIG. 16 shows an n-type GaAs substrate 1, an n-type $Al_{0.63}Ga_{0.37}As$ lower clad layer 2, an $In_{0.484}Ga_{0.516}P$ lower guide layer 3, and an active region 4. In this case, the active region 4 has a double quantum well (DQW) structure composed of barrier layers 5 and well layers 6. There are also shown an $In_{0.484}Ga_{0.516}P$ upper guide layer 7, a p-type $Al_{0.63}Ga_{0.37}As$ upper clad layer 8, a p-type GaAs protective layer 9, a $SiO_2$ current blocking layer 10, an n-side electrode 11, and a p-side electrode 12. The barrier layer 5 is formed of $In_{0.4}Ga_{0.6}P$, in which the strain is −0.62% in tensile strain and the layer thickness is 8 nm for each of the layers 5a and 5c and 7 nm for the layer 5b. It is noted that Eg of $In_{0.4}Ga_{0.6}P$ can be calculated as about 2.02 eV without consideration of strain, but it would be about 1.93 eV-1.96 eV due to influences of tensile strain. The well layers 6 are formed of $In_{0.162}Ga_{0.838}As_{0.671}P_{0.329}$, in which Eg is 1.57 eV, there holds a lattice matching with the substrate, and the layer thickness is 5 nm for each of the layers 6a and 6b. Also, the AlGaAs upper clad layer 8 has a ridge stripe structure with the stripe width being 2.5 μm.

In the semiconductor laser device in which no Al is contained in the well layers nor in the barrier layers, an $In_{0.4}Ga_{0.6}P$ barrier layer is inserted between an $In_{0.484}Ga_{0.516}P$ guide layer (Eg=1.89 eV) and an InGaAsP well layer so that a difference in Eg, "ΔEg," from layers adjacent to the well layers (i.e., barrier layers 5) becomes 0.36 eV to 0.39 eV, which is larger than that of semiconductor laser devices in which Al is contained in the well layers and the barrier layers. For example, in the quantum well structure of AlGaAs-based semiconductor lasers, normally, ΔEg=approx. 0.25 eV. Thus, in semiconductor laser devices in which no Al is contained in the well layers nor in the barrier layers, a material that allows the largest possible ΔEg to be obtained is selected as the Al-free material for the barrier layer 5 in order to fulfill secure confinement of carriers.

However, the semiconductor laser device of the InGaAsP-based quantum well structure containing no Al in the well layers nor in the barrier layer has the following problems. That is, measuring the characteristics of the semiconductor laser device showed as high a threshold current as 100 mA, which means that good characteristics are not obtained. Its temperature characteristic is also so poor that the semiconductor laser device does not oscillate at 80° C. or higher. In the case of an AlGaAs-based semiconductor laser device of the 780 nm band in which Al is contained in the well layers and the barrier layers, the threshold current is 35 mA and the temperature characteristic is about 110K. As is obvious, as compared with the AlGaAs-based semiconductor laser device, the InGaAsP-based semiconductor laser device is deteriorated in characteristics, conversely.

Accordingly, an object of the present invention is to provide an Al-free semiconductor laser device capable of remarkably improving the characteristics regardless of the level of ΔEg, as well as an optical disk unit using the semiconductor laser device.

In order to achieve the above object, according to a first aspect of the present invention, there is provided a semiconductor laser device having an oscillation wavelength of larger than 760 nm and smaller than 800 nm in which at least a lower clad layer, a lower guide layer, an active region, an upper guide layer and an upper clad layer are supported by a GaAs substrate, the active region having a quantum well structure in which one or more well layers and barrier layers are stacked, wherein the one or more well layers and the barrier layers are formed of any one of InGaP, InGaAsP and GaAsP, and the upper and/or lower guide layer is formed of $Al_zGa_{1-z}As$ ($0.20 < z \leq 1$).

As will be detailed later, with InGaAsP varied in mole fractions, the values of conduction-band energy (Ec) and valence-band energy (Ev) vary even if Eg remains unchanged. In particular, in the case of InGaAsP having such mole fractions that its lattice constant is close to that of the GaAs substrate, Eg extends toward the valence-band side. Due to this, with an InGaAsP-based material used for the well layer and the barrier layer, even if ΔEg between those layers is set to a larger value, the Ev difference (|ΔEv|) alone would become larger, while a value of Ec difference (|ΔEc|) comparable to that of AlGaAs-based semiconductor laser device cannot be ensured.

Accordingly, in the case of a semiconductor laser device of the 780 nm band using InGaP for the barrier layers and the guide layers, there would occur overflow of electrons due to a small |ΔEc|, which would cause poor characteristics such as increase in threshold current or deterioration of temperature characteristic.

With the above-described constitution of the present invention, an AlGaAs guide layer having a mole fraction of Al in the group-III elements that is larger than 0.20 is provided outside the corresponding barrier layer containing no Al and formed of any one of InGaP, InGaAsP and GaAsP. Therefore, |ΔEc| between the well layer, which contains no Al and formed of any one of InGaP, InGaAsP and GaAsP, and the guide layer, is set to about 0.12 eV or larger. This value of about 0.12 eV corresponds to a value of ΔEc between the barrier layer and the well layer resulting when AlGaAs having a group-III Al mole fraction of about 0.27 is used as the barrier layer in the quantum well structure of an AlGaAs-based semiconductor laser. Therefore, the overflow of electrons is suppressed equally or more than in an AlGaAs-based semiconductor laser.

As a result of this, the overflow of electrons from the well layer, which has been a cause of poor characteristics in the semiconductor laser device using the InGaP guide layer, can be solved, so that the characteristics of the semiconductor laser device of the 780 nm band containing no Al in the active region are improved remarkably. Furthermore, by virtue of the presence of the barrier layer containing no Al, the well layer is never neighbored in contact by the AlGaAs guide layer containing Al. Thus, high reliability is ensured.

In one embodiment, a value of z representing a mole fraction of Al in the group-III elements of the upper and/or lower guide layer is larger than 0.25.

In this embodiment, |ΔEc| between the AlGaAs guide layer and the well layer is securely made larger than 0.12 eV. Thus, the overflow of electrons from the well layer(s) can be suppressed reliably.

In one embodiment, the upper and lower clad layers contain Al, and a value of z is smaller than a value of an Al mole fraction of the upper and lower clad layers.

In this embodiment, |ΔEc0| and |ΔEv0|, which are an Ec difference and an Ev difference of the AlGaAs guide layer from the GaAs substrate, respectively, become smaller than those of the lower clad layer and the upper clad layer. Therefore, the overflow of electrons is suppressed in the guide layer(s), so that the temperature characteristic can be improved.

In one embodiment, the value of z varies stepwise or continuously and in such a fashion as to increase with increasing nearness to the upper and lower clad layers.

In this embodiment, |ΔEc0| and |ΔEv0| of the AlGaAs guide layer(s) increase more and more from the well layer side toward the lower clad layer and upper clad layer side. Therefore, the overflow of electrons is suppressed more reliably in the guide layers.

In one embodiment, a value of z of at least a portion in contact with a barrier layer of the upper and/or lower guide layer is smaller than 0.4.

In this embodiment, the Al mole fraction become lower in a region of the guide layer(s) closer to the well layer(s). Therefore, adverse effects of Al on the reliability can be prevented.

In one embodiment, the one or more well layers have a compressive strain.

Therefore, a reduction in threshold current can be achieved.

In one embodiment, the barrier layers have a tensile strain.

In this embodiment, with a compressive strain introduced in the well layer(s) for reduction in threshold current, the barrier layers in which a tensile strain is introduced exhibit a strain-compensating function. Therefore, defects within crystals are reduced, and higher reliability can be obtained.

According to a second aspect of the present invention, there is provided a semiconductor laser device having an oscillation wavelength of larger than 760 nm and smaller than 800 nm in which at least a lower clad layer, an active region and an upper clad layer are supported by a GaAs substrate, the active region having a quantum well structure in which one or more well layers and barrier layers are stacked, wherein the barrier layers are formed of an $In_{1-x}Ga_xAs_{1-y}P_y$ having a band gap energy larger than that of the well layers, and there hold relationships that $0<x\leq 1$, $0.2<y<0.75$, and $|(a2-a1)/a1|\times 100>0.65$, where a1 is a lattice constant of the one or more well layers, and a2 is a lattice constant of the barrier layers.

As will be detailed later, in the case where an InGaP barrier layer is used in a semiconductor laser device of the 780 nm band, there have been occurrence of:
1) a reduction in the efficiency of hole injection into the well layer(s) due to the extension of Ev of the barrier layer; and
2) an overflow of electrons due to a small |ΔEc|, which have caused poor characteristics.

In this connection, with InGaAsP varied in mole fractions, the values of conduction-band energy (Ec) and valence-band energy (Ev) vary even if Eg remains unchanged. In the case where InGaAsP is used for the barrier layer, with Eg unchanged, Eg extends toward the valence-band side with increasing nearness to the InGaP mole fraction, so that |ΔEv| between the well layer and the barrier layer increases while |ΔEc| decreases. Conversely, Eg extends toward the conduction-band side with increasing nearness to the GaAsP mole fraction, so that |ΔEv| between the well layer and the barrier layer decreases while |ΔEc| increases. Then, variations of Ev has connection particularly with the mole fraction of the P element in InGaAsP, while variations of Ec has connection particularly with the difference in strain quantity from the well layer.

In this case, since the barrier layer is formed of GaAsP or InGaAsP and the P-element mole fraction is larger than 0.2 and smaller than 0.75, the Ev difference, |ΔEv0|, from the GaAs substrate can be set smaller, compared with the InGaP barrier layer. Therefore, the efficiency of hole injection from the guide layer to the well layer is improved to a large extent.

Further, the strain quantity of the barrier layer with respect to the well layer is set to not less than 0.65%. Accordingly, ΔEc between the barrier layer and the well layer is set to not less than about 0.12 eV. This value of about 0.12 eV corresponds to a value of ΔEc between the barrier layer and the well layer resulting when AlGaAs having a group-III Al mole fraction of about 0.27 is used as the barrier layer in the quantum well structure of an AlGaAs-based semiconductor laser. Therefore, the overflow of electrons from the well layer can be suppressed.

Thus, the causes of poor characteristics in the semiconductor laser device using the InGaP barrier layer are solved. As a result, the characteristics of the semiconductor laser device of the 780 nm band using GaAsP or InGaAsP having a mole fraction close to that of GaAsP are improved remarkably. With those materials, it has been conventionally considered to be incapable of obtaining effectiveness because of small Eg.

In one embodiment, given that a lattice constant of the GaAs substrate is a0, a value of (a1−a0)/a0 is a positive value.

In this embodiment, the strain of the well layer with respect to the GaAs substrate is compressive strain. Therefore, for example, even if the lattice constant a2 of the barrier layer is set to a tensile strain smaller than that of the lattice constant a0 of the GaAs substrate, average strain quantity for the whole active region can be suppressed. Accordingly, the quantity of defects within crystals can be reduced, so that the reliability can be improved, and that the critical layer thickness of the whole active region is increased, allowing the barrier layer to be set larger in layer thickness. Moreover, since the well layer has a compressive strain, there can be obtained a semiconductor laser device whose polarization mode is TE mode.

In one embodiment, no Al element, which is an active substance that would react even with a trace quantity of impurities such as oxygen, is contained in the well layer(s) or the barrier layers. Therefore, high reliability can be obtained even at a high-temperature, high-power state.

In one embodiment, the one or more well layers are formed of InGaAsP.

In this embodiment, Eg of the InGaAsP well layer extends toward the valence-band side, compared with the GaAs substrate, so that $|\Delta Ec0|<|\Delta Ev0|$. Conversely, in the case where the well layer is formed of AlGaAs, Eg of the well layer extends toward the conduction-band side so that $|\Delta Ec0|>|\Delta Ev0|$. Therefore, in a combination of the InGaAsP well layer and barrier layer, $|\Delta Ec|$ between the well layer and the barrier layer becomes lager and $|\Delta Ev|$ therebetween becomes smaller, compared with the case where the well layer is formed of AlGaAs. Consequently, $|\Delta Ec|$ between the well layer and the barrier layer becomes larger so that the overflow of electrons is suppressed, thereby making it possible to achieve lower threshold current, higher differential efficiency and higher temperature characteristic.

In one embodiment, any or every one of the barrier layers is in contact with an AlGaAs layer at a surface of the barrier layer opposite from a well layer.

In this embodiment, since the barrier layer is in contact with an AlGaAs layer, there is formed a larger barrier against the AlGaAs layer on the conduction-band side. Therefore, by making the AlGaAs layer placed on one side opposite to the well layer side, part of electrons that have overflowed from the well layer to the barrier layer can be inhibited from further overflowing to the AlGaAs layer. Thus, the electron confinement effect to the well layer is further increased, so that the characteristics are further improved.

In one embodiment, the barrier layer in contact with the AlGaAs layer is an outermost layer in the active region.

Therefore, part of electrons are inhibited from overflowing outside of the active region, so that the electron confinement effect is further increased.

In one embodiment, a layer thickness of the barrier layer in contact with the AlGaAs layer is larger than 4 nm.

In this embodiment, the influence of Al in the AlGaAs layer is suppressed to a large extent, so that high reliability can be obtained even at a high-temperature, high-power state.

In one embodiment, a value of x representing a mole fraction of Ga in the group-III elements of the barrier layers is smaller than 1.

In this embodiment, the growth of dislocations is suppressed by the In element of the InGaAsP barrier layer, so that further higher reliability can be obtained.

In one embodiment, the semiconductor laser device further includes a guide layer formed of AlGaAs and placed between the active region and the upper and/or lower clad layer.

In this embodiment, a large barrier is formed between the active region and the AlGaAs guide layer on the conduction-band side. Therefore, the overflow of electrons to the guide layer located outside the active region is suppressed, thereby making it possible to achieve remarkable improvements in threshold current and characteristic temperature, compared with the case where the InGaAsP guide layer is used. Furthermore, lattice matching with the GaAs substrate also becomes achievable.

In one embodiment, the upper and/or lower clad layer is formed of AlGaAs.

In this embodiment, the overflow of electrons from the barrier layer or the guide layer can be further suppressed. Further, since AlGaAs is maintained in lattice matching with the GaAs substrate even upon occurrence of fluctuations of group-III mole fractions, the whole clad layer having a thickness of 1 µm or more can securely be maintained in lattice matching with the GaAs substrate.

In one embodiment, the semiconductor laser device further includes a guide layer formed of InGaP or InGaAsP and placed between the active region and the upper and/or lower clad layer, and the upper and/or lower clad layer is formed of AlGaInP or InGaP.

In this embodiment, whereas the guide layer is formed of InGaP or InGaAsP, the InGaAsP barrier layer functions as a barrier between the well layer and the guide layer on the conduction-band side. Therefore, by selecting an optimum layer thickness of the barrier layer, electrons are enough held within the well layer, so that successful device characteristics can be obtained.

Further, the clad layer is formed of AlGaInP or InGaP. Like this, since AlGaInP or InGaP, which is larger in $|\Delta Ev0|$, i.e. Ev difference from the GaAs substrate, than InGaP or InGaAsP of the guide layer is used as the clad layer, a band structure in which the $|\Delta Ev0|$ of the clad layer is larger than that of the guide layer can be obtained. Therefore, the injection of holes into the well layer can be implemented without any problem.

Furthermore, no Al is contained not only in the well layer or the barrier layer but also in the guide layer outside the active region. Therefore, even higher reliability can be obtained even at a high-temperature, high-power operation state.

In one embodiment, a value of y representing a mole fraction of P in the group-V elements of the barrier layers is larger than 0.25.

In this embodiment, by ensuring that $|\Delta Ev0|$ of the barrier layers is larger than $||Ev0|$ of the well layer(s), the injected holes are securely confined in the well layer.

In one embodiment, a value of y representing a mole fraction of P in the group-V elements of the barrier layers is smaller than 0.6.

In this embodiment, $|\Delta Ev0|$ of the barrier layers can be set to a small one more reliably. Therefore, the injection of holes from the guide layer into the well layer can be achieved more reliably.

There is also provided, according to a third aspect of the present invention, an optical disk unit in which the semiconductor laser device according to any one of the first and second aspects of the present invention is used as a light-emitting device.

In the optical disk unit with the above arrangement, the semiconductor laser device that operates with a higher optical power than hitherto is used as its light-emitting device for use of CD/MD. Therefore, data read-and-write operations are implementable even if the rotational speed of the optical disk is enhanced higher than before. In particular, the access time to optical disks, which has hitherto mattered in write operations to CD-Rs, CD-RWs (CD-rewritables) or the like, can be reduced to a large extent.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, the present invention will be described in detail by way of embodiments thereof illustrated in the accompanying drawings.

First Embodiment

Figure 1:
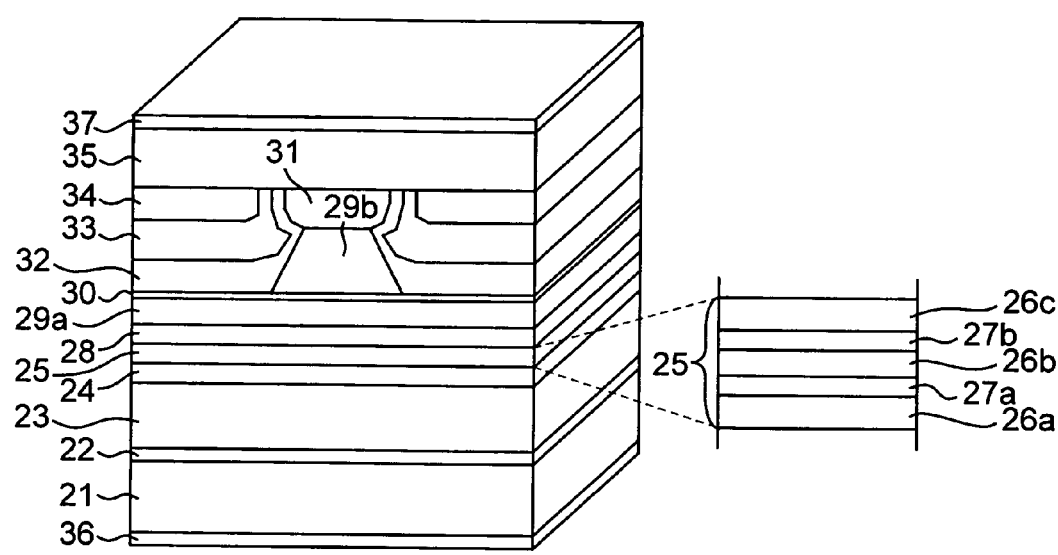
FIG. 1 shows the structure of a semiconductor laser device according to the present invention.

FIG. 1 shows the structure of a semiconductor laser device according to a first embodiment. This embodiment relates to a semiconductor laser device with an oscillation wavelength of 780 nm having a quantum well active region of InGaAsP well layer/InGaP barrier layer as well as AlGaAs guide layers.

FIG. 1 shows an n-type GaAs substrate 21, an n-type GaAs buffer layer (layer thickness: 0.5 µm) 22, an n-type $Al_{0.5}Ga_{0.5}As$ lower clad layer (layer thickness: 1.7 µm) 23, an $Al_{0.35}Ga_{0.65}As$ lower guide layer (layer thickness: 45 nm) 24, and an active region 25. In this case, the active region 25 has a double quantum well (DQW) structure composed of barrier layers 26 and well layers 27. There are also shown an $Al_{0.35}Ga_{0.65}As$ upper guide layer (layer thickness: 45 nm) 28, a p-type $Al_{0.5}Ga_{0.5}As$ first upper clad layer (layer thickness: 0.2 µm) 29a, a p-type GaAs etching stopper layer (layer thickness: 3 nm) 30, a ridge-stripe shaped p-type $Al_{0.5}Ga_{0.5}As$ second upper clad layer (layer thickness: 1.28 µm) 29b, a p-type GaAs protective layer (layer thickness: 0.7 µm) 31, an n-type $Al_{0.7}Ga_{0.3}As$ first current blocking layer (layer thickness: 0.6 µm) 32, an n-type GaAs second current blocking layer (layer thickness: 0.7 µm) 33, a p-type GaAs buried protective layer (layer thickness: 0.6 µm) 34, a p-type GaAs cap layer (layer thickness: 2 µm) 35, an n-side electrode 36, and a p-side electrode 37.

The barrier layers 26 each are formed of $In_{0.4}Ga_{0.6}P$, where the strain is −0.62% in tensile strain and the layer thickness is 8 nm for the barrier layers 26a and 26c and 7 nm for the layer 26b. It is noted that Eg of $In_{0.4}Ga_{0.6}P$ can be calculated as about 2.02 eV without consideration of strain, but it would be about 1.93 eV-1.96 eV due to influences of tensile strain. The well layers 27 are each formed of $In_{0.162}Ga_{0.838}As_{0.671}P_{0.329}$, where Eg is 1.57 eV, there holds a lattice matching with the substrate, and the layer thickness is 5 nm for both of the layers 27a and 27b. It is noted that |ΔEg| between the well layers 27 and the barrier layers 26 is 0.36 eV to 0.39 eV. Also, Eg of the AlGaAs guide layers 24, 28 is 1.86 eV.

In this connection, in this AlGaAs-based semiconductor laser device, in which |ΔEg| between well layer and barrier layer is normally about 0.25 eV, a ΔEg value of about 0.20 eV would cause a carrier overflow, which could lead to a characteristic deterioration.

The InGaAsP well layer/InGaP barrier layer/AlGaAs guide layer semiconductor laser device of the above constitution can be fabricated in the following manner. First, on a GaAs substrate 21 having (100) plane are formed through crystal growth by metal organic chemical vapor deposition process, one after another, a GaAs buffer layer 22, an AlGaAs lower clad layer 23, an AlGaAs lower guide layer 24, an active region 25 of a DQW structure composed of alternately disposed three barrier layers 26 and two well layers 27, an AlGaAs upper guide layer 28, an AlGaAs first upper clad layer 29a, a GaAs etching stop layer 30, an AlGaAs second upper clad layer 29b, and a GaAs protective layer 31. Further, a resist mask having a stripe along the (011) direction is formed by photolithographic process on the GaAs protective layer 31 at a portion where a ridge stripe is to be formed.

Next, only the GaAs protective layer 31 and the AlGaAs second upper clad layer 29b in the portions other than the resist mask are removed by etching, by which a ridge stripe portion is formed. Then, an AlGaAs first current blocking layer 32, a GaAs second current blocking layer 33, and a GaAs buried protective layer 34 are crystal-grown one after another on the whole ridge stripe portion including its upper side and both lateral sides by the metal organic chemical vapor deposition process. In this process, on the ridge stripe portion, the current blocking layers 32, 33 and the protective layer 34 are formed in a protrusive shape reflecting the shape of the ridge stripe portion.

Next, a resist mask is formed over the GaAs buried protective layer 34 except the protrusive-shaped portion. Then, the protrusive-shaped buried protective layer 34, second current blocking layer 33 and first current blocking layer 32 are removed by etching one after another, thereby making a top portion of the ridge stripe portion exposed. Thereafter, a GaAs cap layer 35 is crystal-grown overall by metal organic chemical vapor deposition process. Finally, an n-side electrode 36 is formed on the surface of the substrate 21, and a p-side electrode 37 is formed on the surface of the cap layer 35. In this way, the semiconductor laser device of the InGaAsP well layer/InGaP barrier layer/AlGaAs guide layer having a buried ridge structure whose stripe width is 2.5 μm is formed.

Then, after subjecting the thus fabricated semiconductor laser device to cleaving at a resonator length of 800 μm, application of end-face reflective coating and mounting onto a stem, device characteristics were measured. As a result, the semiconductor laser device showed a threshold current of Ith=38 mA and a temperature characteristic of T0=108K. Thus, as compared with the semiconductor laser device with the InGaAsP-based quantum well structure in which no Al is contained in the well layers nor in the barrier layers, the semiconductor laser device of this embodiment can improve both the threshold current Ith and the temperature characteristic T0 at the same time in spite of the well layers 27 and the barrier layers 26 being similar to those in the semiconductor laser device of the InGaAsP-based quantum well structure. Reasons of this will be discussed below.

(Desk Study of Ec, Ev)

Eg of semiconductor is a difference between the energy of conduction band (Ec) and the energy of valence band (Ev). However, even with an identical Eg, Ec and Ev differ depending on the material type, the mole fraction or the like. It is generally said that the AlGaAs family are higher in Ec and Ev, whereas the InGaAsP family are lower in Ec and Ev. At an heterointerface between different semiconductor layers, a difference (ΔEc) between Ec's of the two layers or a difference (ΔEv) between their Ev's affects the behavior of electrons or carriers. Therefore, considerations are given to Ec and Ev for the composition of InGaAsP used in the well layers 27 and composition of AlGaAs used in the guide layer 24 in the semiconductor laser device of this embodiment, and their relationship is discussed below.

In the following description, magnitudes of Eg, Ec and Ev of semiconductor will be expressed in terms of |ΔEg0|, |ΔEc0| and |Ev0|, which are values of differences from reference values Eg, Ec and Ev of GaAs that is used in the substrate in both semiconductor laser devices. Also, it holds that |ΔEg0|=|ΔEc0|+|ΔEv0|. Here, the proportion of |ΔEc0| in |ΔEg0| is expressed as |ΔEc0|/|ΔEg0|.

Then, with respect to |ΔEc0|/|ΔEg0| of InGaP, a numerical value of $$|\Delta Ec0|/|\Delta Eg0|=0.18$$

is disclosed in Appl. Phys. Lett. 66, p. 1785 (1995), and this is used for discussions. Meanwhile, with respect to |ΔEc0|/|ΔEg0| of GaAsP, its value is generally known to be larger than that of InGaP, but a specific numerical value is unknown. Therefore, several values are set as |ΔEc0|/|ΔEg0| of GaAsP. Also with respect to InGaAsP, which has mole fractions between those of InGaP and GaAsP, a discussion is made below as to how |ΔEg0|, |ΔEc0| and |ΔEv0| of InGaAsP vary with various mole fractions, with an assumption that the values vary between the value of InGaP and the value of GaAsP depending on mole fractions. Here is shown a case where |ΔEc0|/|ΔEg0| of GaAsP is 0.60, as an example most suited to actual GaAsP characteristics. Further, with respect to Eg itself of the InGaAsP family as well, the relationship with mole fractions were estimated based on experimental results. This is because although some relational expressions with mole fractions have already been posed for Eg of the InGaAsP family, those relational expressions are different from one another and have not yet been clarified. With respect to the |ΔEc0|/|ΔEg0| of AlGaAs, it is generally said to be 0.6 to 0.65, and discussions were made with a value of 0.6 adopted.

Figure 4:
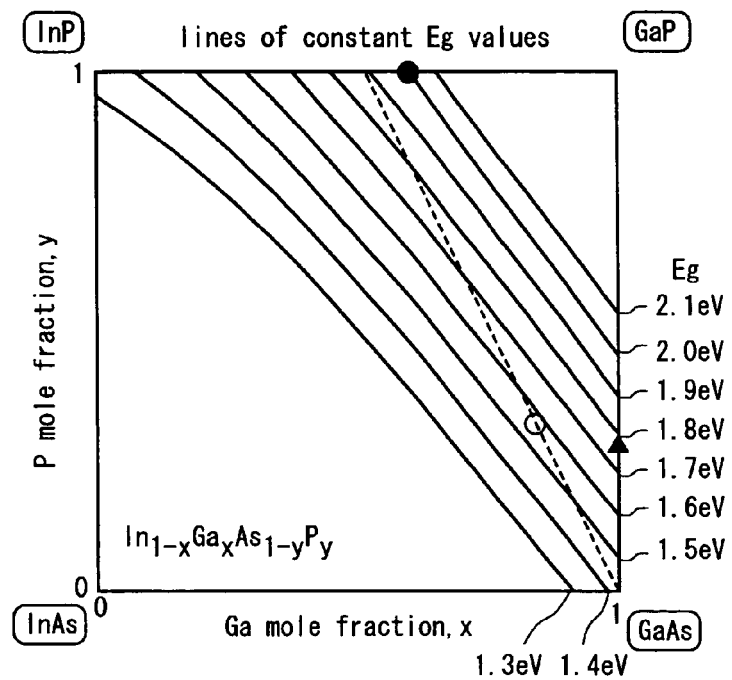
FIG. 4 shows lines of constant Eg values of InGaAsP.
Figure 5:
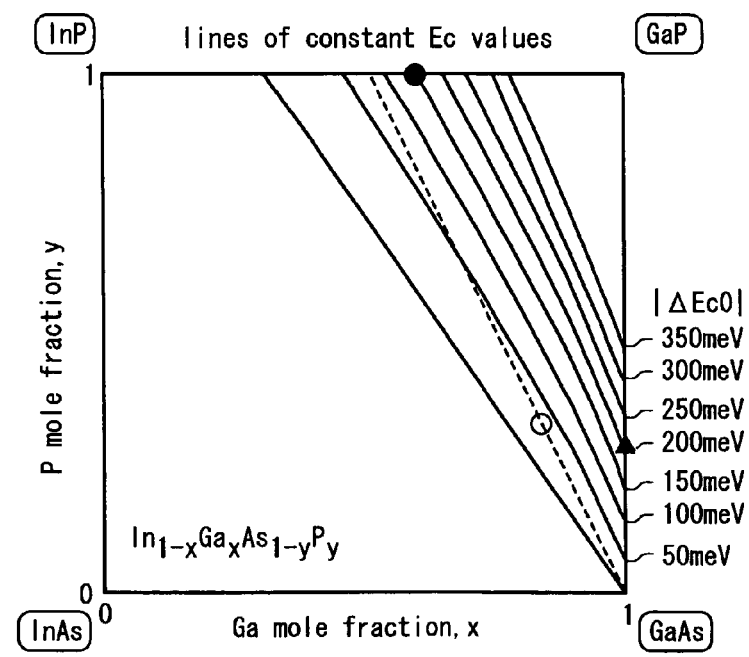
FIG. 5 shows lines of constant Ec values of InGaAsP.
Figure 6:
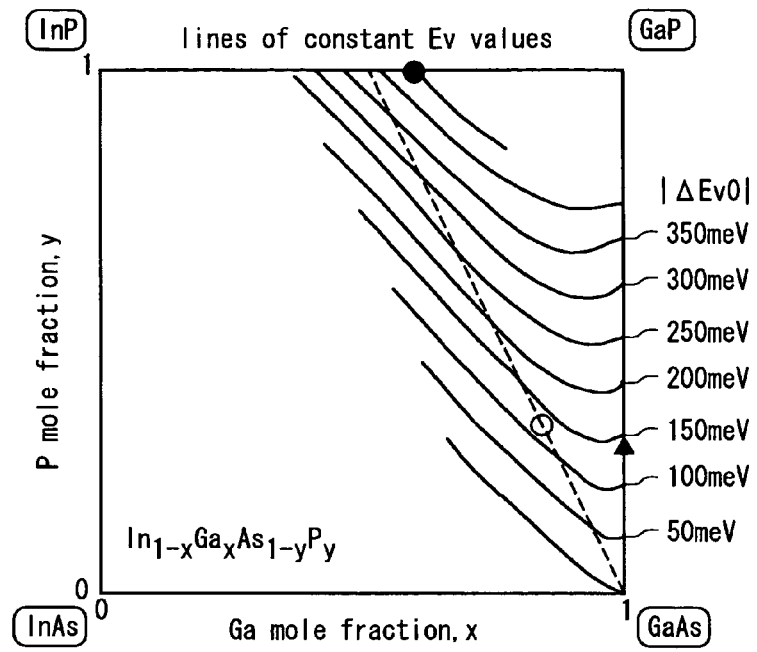
FIG. 6 shows lines of constant Ev values of InGaAsP.
Figure 7:
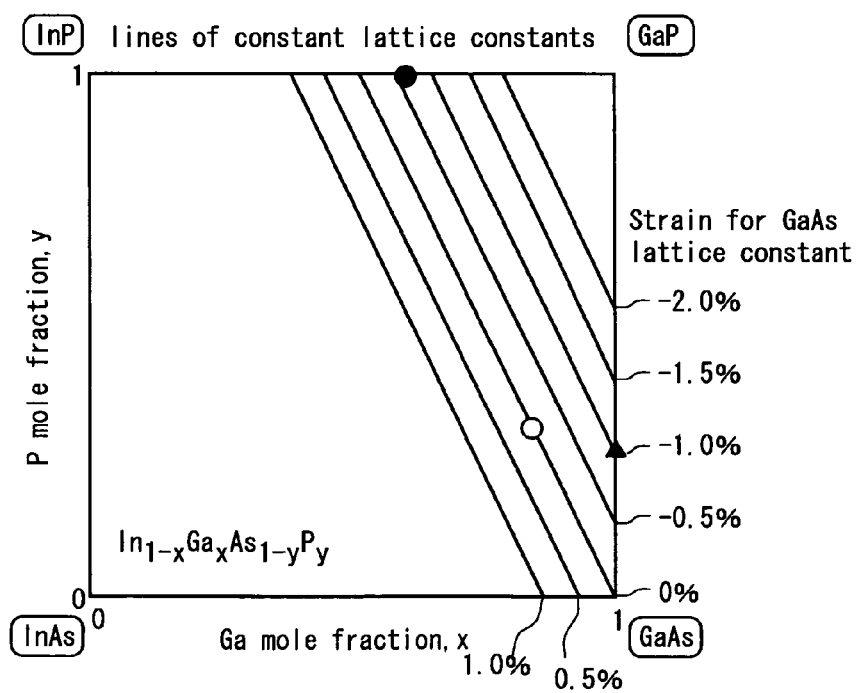
FIG. 7 shows lines of constant lattice constants of InGaAsP.

FIG. 4 is a view in which lines of constant Eg values of InGaAsP are charted by connecting points (x, y) which hold the Eg values constant, on a plane on which the group-III Ga mole fraction is represented by the axis of abscissas, x, while the group-V P mole fraction is represented by the axis of ordinates, y. FIG. 5 is a view in which lines of constant Ec values are charted by connecting points (x, y), which hold the Ec values constant on a plane on which the group-III Ga mole fraction is represented by the axis of abscissas, x, while the group-V P mole fraction is represented by the axis of ordinates, y. It is noted that |ΔEc0| is depicted at equal intervals of 50 meV. Also, FIG. 6 is a view in which lines of constant Ev values are charted by connecting points (x, y) which hold the Ev values constant, on a plane on which the group-III Ga mole fraction is represented by the axis of abscissas, x, while the group-V P mole fraction is represented by the axis of ordinates, y. It is noted that |ΔEv0| is depicted at equal intervals of 50 meV. FIG. 7 is a view in which lines of constant strain values (lines of constant lattice constants) of GaAs are charted on a plane on which the group-III Ga mole fraction is represented by the axis of abscissas, x, while the group-V P mole fraction is represented by the axis of ordinates, y. In this connection, with respect to variations of Eg, Ec and Ev due to strain, an example of their evaluation on a case of compressive strain of InGaP is disclosed in J. Appl. Phys., 54, 4, pp. 2052-2056 (1983). However, their variations due to various mole fractions of InGaAsP and GaAsP are unknown, and so influences of strain are not taken into consideration in FIGS. 4 to 6.

In comparison of the lines of constant Eg values, the lines of constant Ec values and the lines of constant Ev values, it can be understood that as the mole fractions approach InGaP along the lines of constant Eg values, |ΔEv0| increases, while |ΔEc0| decreases to some extent, so that Eg extends toward the valence band side. Conversely, it can be understood as the mole fractions approach GaAsP, |ΔEv0|Δ decreases, while |Ec0| increases so that Eg extends toward the conduction band side.

Figure 8:
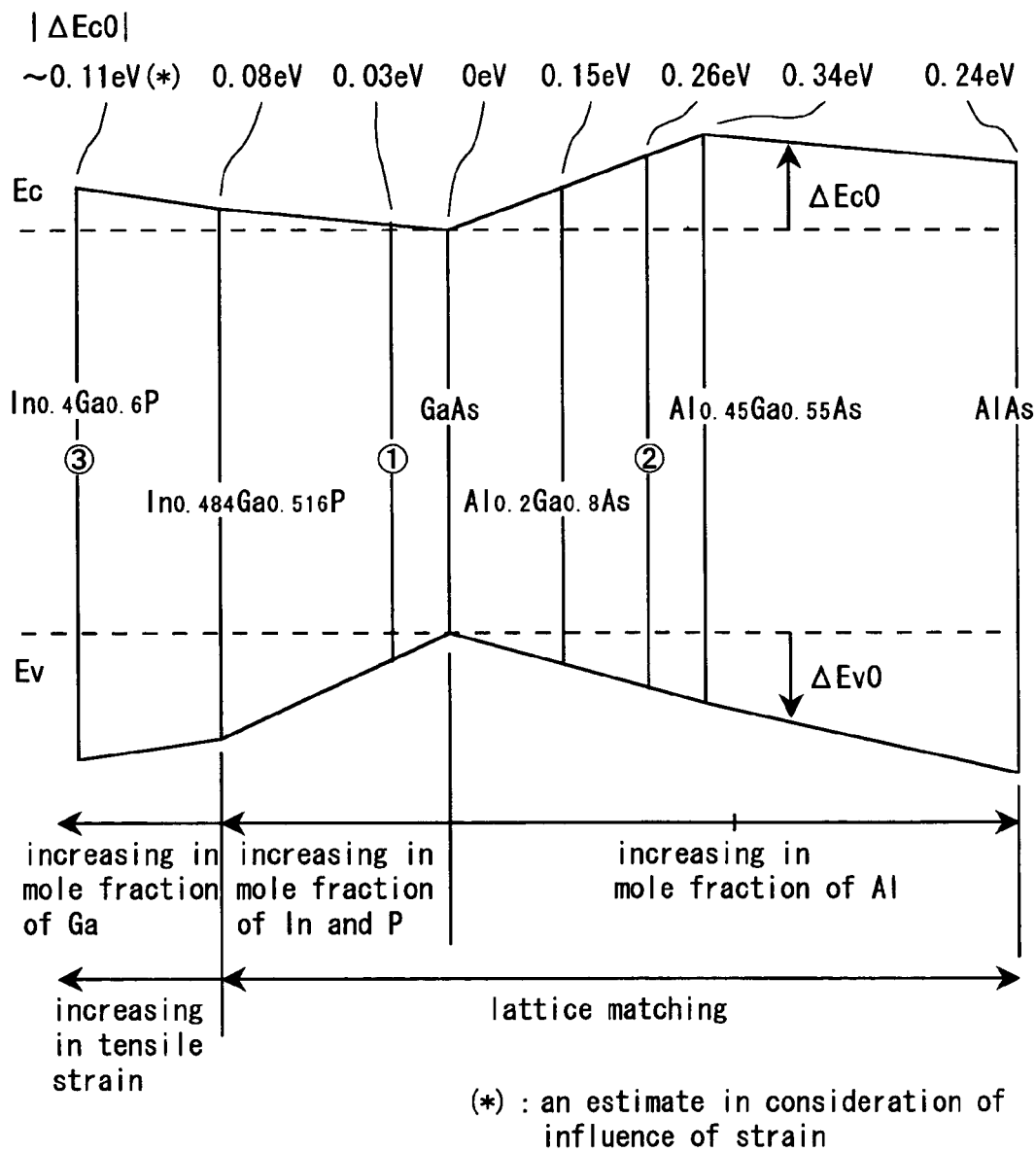
FIG. 8 shows a relationship among Ec and Ev values of GaAs, InGaAsP and AlGaAs providing lattice matching with the GaAs substrate and of $In_{0.4}Ga_{0.6}P$.

FIG. 8 shows a relationship among Ec and Ev values of InGaAsP and AlGaAs holding in lattice matching on the GaAs substrate. It can be seen that the InGaAsP materials are larger in |ΔEv0| and smaller in |ΔEc0| than AlGaAs materials. For the sake of comparison, FIG. 8 also shows data about $In_{0.4}Ga_{0.6}P$, which corresponds to the barrier layers 26 in this embodiment. It is noted that $In_{0.4}Ga_{0.6}P$ has a tensile strain of −0.64%, and an estimate in consideration of influence of strain for |ΔEc0| is described in FIG. 8. This estimate is derived from reports on variations in Eg with compressively strained InGaP, and so the estimate value is merely a rule-of-thumb value.

(Comparison between Desk-study Charts and the Embodiment, and Effects Found from FIGS. 4 to 7)

FIGS. 4 to 7 show mole fraction (x, y) points of the InGaAsP well layer 27 and the InGaP barrier layer 26 in the semiconductor laser device of this embodiment by o and , respectively. In this case, since the InGaP barrier layers 26 have tensile strain, it is considered that all of Eg, |ΔEc0| and |ΔEv0| would actually be smaller values. |ΔEc0| can be read from FIG. 5, and |ΔEv0| can be read from FIG. 6. Also, FIG. 8 shows mole fractions corresponding to the well layer 27, the guide layers 24, 28 and the barrier layer 26 by ①, ② and ③, respectively. Based on this, charting relationships among the energy bands of the GaAs substrate 21, the InGaAsP well layer 27, the InGaP barrier layer 26 and the AlGaAs guide layers 24, 28 results in a diagram shown in FIG. 3. Further, charting energy bands of the active region and its vicinity in the device structure of this embodiment results in a diagram shown in FIG. 2A. In addition, energy bands of the semiconductor laser device using InGaP guide layers as a comparative example are shown in FIG. 2B, where the clad layers are of the composition of $Al_{0.5}Ga_{0.5}As$ in accordance with this embodiment.

Figure 2:
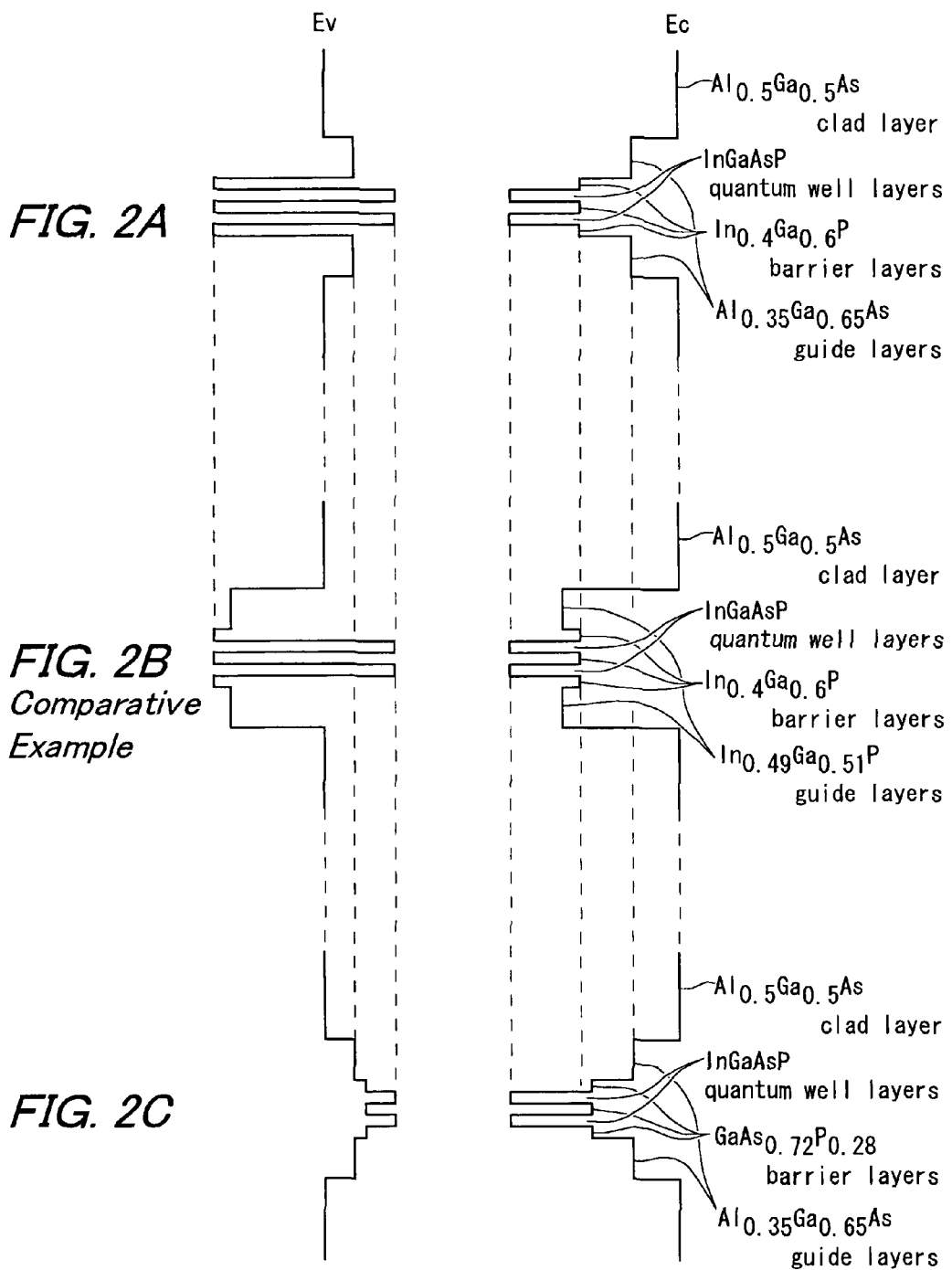
FIGS. 2A, 2B and 2C show energy bands of the active region and its vicinity in the semiconductor laser device shown in FIG. 1 and in semiconductor laser devices having different barrier layer structures, respectively.

Referring to FIGS. 2A and 2B, comparison between the semiconductor laser device of this embodiment and the semiconductor laser device of the comparative example clearly indicates that, in comparison of their guide layers with each other, the semiconductor laser device of this embodiment is smaller in terms of Eg of the guide layer than the semiconductor laser device of the comparative example, but conversely larger in terms of $|\Delta Ec|$ of the well layer and the guide layer. Therefore, it can be presumed that the overflow of electrons from the InGaP barrier layers 26 was suppressed by the AlGaAs guide layers 24, 28, which led to a reduction in threshold current and an increase in temperature characteristic, as compared with the semiconductor laser device of the comparative example having InGaP guide layers.

(Determination of Effective Range for Mole Fractions of AlGaAs Guide Layer)

FIGS. 5 and 6 are based on the assumption that $|\Delta Ec0|/|\Delta Eg0|$ of GaAsP is 0.60 as described above, and true curves are unknown. However, seeing that device characteristics obtained from the semiconductor laser device of this embodiment and the semiconductor laser device of the comparative example are not so much different from the presumptions by FIGS. 5 and 6 as described above, it can be decided that the tendencies of the curves shown in FIGS. 4 to 7 roughly represent the actualities.

Now, based on this decision, the range of $|\Delta Ec0|$ that allows the composition of AlGaAs to effectively function as a barrier layer will be described below.

Considering that electrons are dominant in carrier overflow from the well layer, $|\Delta Ec0|$ is set so as not to be smaller than necessary. In the InGaAsP well layer in the semiconductor laser device having an oscillation wavelength of 780 nm, it is presumed that $|\Delta Ec0|$ is approx. 0.03 eV and $|\Delta Ev0|$ is approx. 0.12 eV. However, these values are not precise because they vary depending on the strain quantity of the well layer or the like.

First, the minimum value of $|\Delta Ec0|$ needs to be set so that $\Delta Ec$ between the guide layer and the well layer becomes about 0.12 eV or more, in order to prevent the overflow of electrons from the well layer. This value of 0.12 eV corresponds to a case where AlGaAs having a group-III Al mole fraction of about 0.27 is used as the guide layer in a semiconductor laser device of 780 nm band having an AlGaAs well layer. In the case of the semiconductor laser device of this embodiment, since the well layers 27 are formed of InGaAsP with $|\Delta Ec0|$=approx. 0.03 eV, it involves a condition that $|\Delta Ec0|$ of guide layers 24, 28 is larger than approx. 0.15 eV (=approx. 0.03 eV+0.12 eV). Then, an AlGaAs corresponding to this $|\Delta Ec0|$ is an AlGaAs having an Al mole fraction larger than 0.20. This is, however, a value for ensuring a minimum necessary $\Delta Ec$, and it is desirable that an AlGaAs having an Al mole fraction of larger than 0.25 is used for the guide layers 24, 28 in order to more stably prevent the overflow of carriers.

A maximum value of $|\Delta Ec0|$ is not particularly taken into consideration based on a reckoning that there would not much influence on electron injection unless a very large barrier is involved. In the case of the semiconductor laser device of this embodiment, a sufficient $\Delta Ec$ has been obtained from the Al mole fraction of 0.35 of the guide layers 24, 28.

(High Reliability by Being Al-Free)

In the first embodiment, since no Al is contained in the well layers 27 nor the barrier layers 26 touching the well layers 27, it is achievable to obtain high reliability even at high-temperature, high-power state. Even if the barrier layers 26 adjacent to the guide layers 24, 28 are eliminated so that the AlGaAs guide layers 24, 28 and the InGaAsP well layers 27 become adjacent to each other, respectively, there is a possibility that the overflow of carries from the well layers 27 can be suppressed. However, this is undesirable because using guide layers 24, 28 containing Al, which contains more impurities, as light-emitting layers or layers adjacent thereto would cause occurrence of non-radiative recombination, which would in turn accelerate the deterioration of crystals in the active region.

Further, in this embodiment, outside the outermost barrier layers 26a, 26c in the quantum well active region are the guide layers 24, 28 of AlGaAs. However, 4 nm or less thicknesses of the InGaP barrier layers 26 would cause a decrease in reliability at high-temperature, high-power state. This could be attributed to an influence of Al of the guide layers 24, 28. Accordingly, making the thickness of the InGaP barrier layers 26 larger than 4 nm makes it possible to suppress the influence of Al of the guide layers 24, 28 to a large extent, so that high reliability can be obtained even at high-temperature, high-power state.

(Advantages of InGaAsP Well Layer Regarding Ec and Ev)

Figure 3:
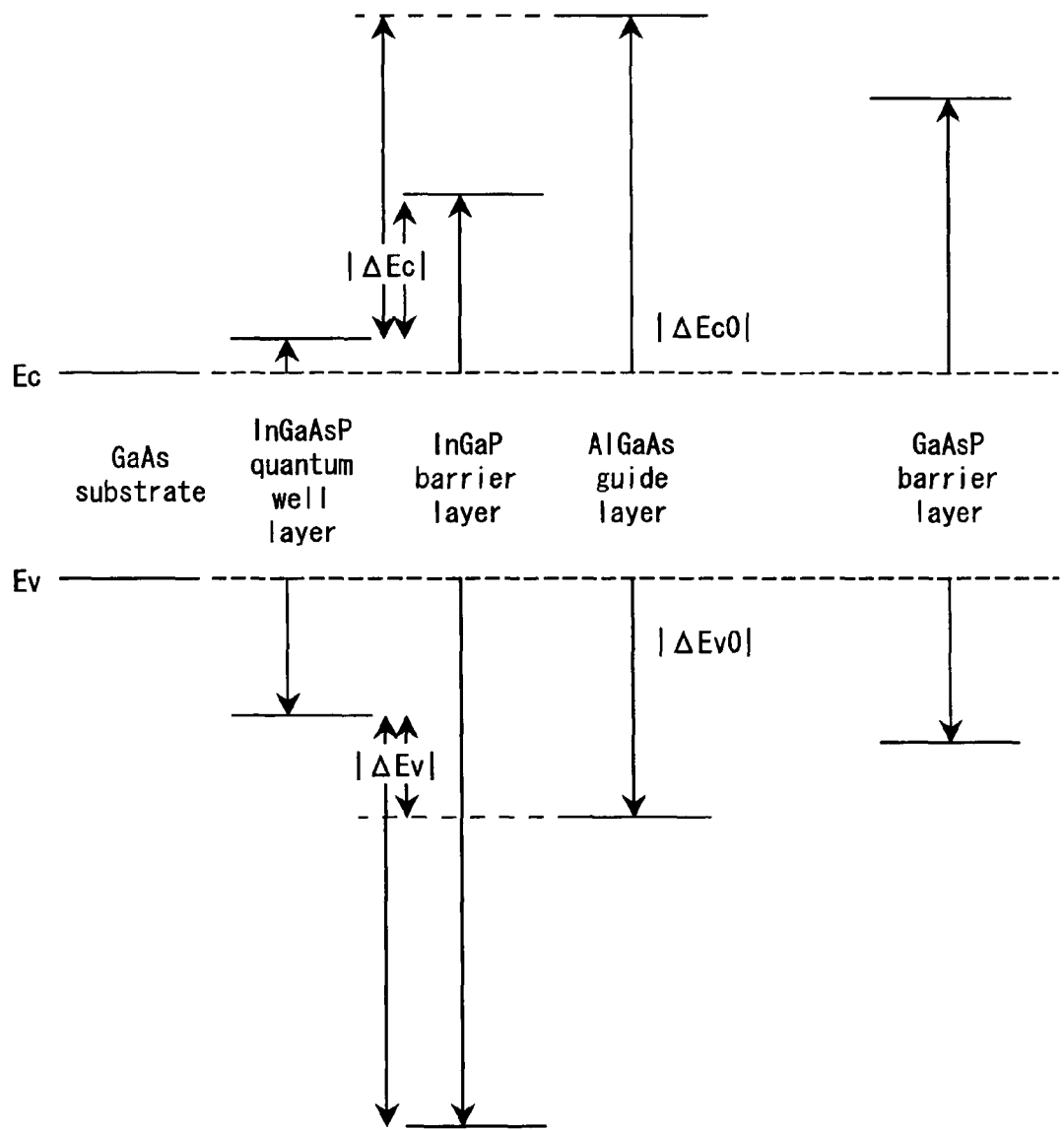
FIG. 3 shows a relationship among the energy bands of the GaAs substrate, the InGaAsP well layer, the InGaP barrier layer, the GaAsP barrier layer, and the AlGaAs guide layer.

As can be seen from FIG. 3, as compared with the GaAs substrate 21, Eg of the InGaAsP well layers 27 extends toward the valence band side so that $|\Delta EC0|<|\Delta Ev0|$. In contrast to this, Eg of the AlGaAs guide layers 24, 28 extends toward the conduction band side so that $|\Delta Ec0|>|\Delta Ev0|$. Accordingly, in regard to $\Delta Ec$ and $\Delta Ev$ between the well layer 27 and the guide layer 24, 28, a combination of the InGaAsP well layers 27 and the AlGaAs guide layers 24, 28 makes it possible to make $|\Delta Ec|$ even larger and $|\Delta Ev|$ even smaller, as compared with the case where, for example, AlGaAs is adopted for the well layers. That is, according to this embodiment, it becomes possible to enlarge $|\Delta Ec|$ while $|\Delta Ev|$ remains small by using the guide layer of a small Eg. Therefore, the effectiveness of this embodiment is produced by setting the Al mole fraction of the guide layers 24, 28 to at least larger than 0.20. It is noted that the Al mole fraction of the guide layers in such a case is smaller by 0.05 or more than the Al mole fraction of the guide layers of a semiconductor laser device of 780 nm band having AlGaAs well layers.

In the semiconductor laser device of this embodiment, the Al mole fraction of the AlGaAs guide layers 24, 28 has been set to 0.35. However, the Al mole fraction needs only to be larger than 0.20, and may be lower than 0.35. In that case, whereas the effectiveness against the overflow of carriers lowers somewhat, it instead becomes possible to further suppress the deterioration of reliability due to Al.

As shown above, in this embodiment, the active region 25 of the semiconductor laser device is provided in a DQW structure composed of barrier layers 26 and well layers 27, the barrier layers 26 being formed of InGaP and the well layers 27 being formed of $In_{0.162}Ga_{0.838}As_{0.671}P_{0.329}$ lattice-matched with GaAs substrate 21. Further, the guide layers 24, 28 are formed of $Al_{0.35}Ga_{0.65}As$. In the case where the guide layers 24, 28 are formed of AlGaAs like this, Eg of the guide layers would decrease as compared with the case where InGaP is used for the guide layers, but |ΔEc| between the well layer and the guide layer can be increased. Therefore, the overflow of electrons from the InGaP barrier layers 26 can be suppressed by the AlGaAs guide layers 24, 28. As a result, it becomes possible to achieve a reduction in threshold current and an improvement in temperature characteristic over the semiconductor laser device with InGaP guide layers.

Further, by the formation of the guide layers 24, 28 of an AlGaAs having an Al mole fraction larger than 0.20, ΔEc between the guide layers 24, 28 and the well layers 27 can be set to 0.12 eV or more, so that the overflow of electrons from the well layers 27 can be suppressed. Furthermore, by the combination with the InGaAsP well layers 27, the guide layers 24, 28 of a small Eg could enlarge |ΔEc| between the well layers 27 and the guide layers 24, 28 while |ΔEv| remains small. That is, barrier formation against the hole injection into the well layers 27 can be prevented and moreover the overflow of electrons from the well layers 27 can be suppressed.

Consequently, as compared with the above-described background-art semiconductor laser device of InGaAsP-based quantum well structure in which no Al is contained in the well layers nor barrier layers and in which InGaP guide layers are used, the device characteristics of the present embodiment can be remarkably improved to a threshold current of Ith=38 mA and a temperature characteristic of T0=108K, notwithstanding a similar constitution of the well layers 27 and the barrier layers 26.

In this connection, since the thickness of the InGaP barrier layers 26 is set larger than 4 nm, the influence of Al of the AlGaAs guide layers 24, 28 can be suppressed to a large extent, so that high reliability can be obtained in a high-temperature, high-power operation.

(Degree of Freedom for Various Constitutions)

Although the InGaAsP well layers 27 have been set to the same lattice constant as that of the GaAs substrate 21 in this embodiment, yet the AlGaAs guide layers 24, 28 are also effective even if strain is applied to the InGaAsP well layers 27, in which case an improvement in device characteristics would result. Further, although the number of wells is two in layers in this embodiment, this is not limitative and similar effects can be obtained with any arbitrary number of wells. Furthermore, although this embodiment has been provided in a buried ridge structure, this is not limitative and similar effects can be obtained with any structure such as a ridge structure, an internal stripe structure and a buried heterostructure.

Still also, although an n-type substrate has been used as the substrate in this embodiment, similar effects can be obtained even if a p-type substrate is used and moreover the n-type and p-type of the individual layers are reversed. Further, although a wavelength of 780 nm has been adopted, this is not limitative and similar effects can be obtained only if the wavelength falls within a so-called 780 nm band which is larger than 760 nm and smaller than 800 nm.

Second Embodiment

This second embodiment relates to a semiconductor laser device with an oscillation wavelength of 780 nm having a quantum well active region of InGaAsP well layers/GaAsP barrier layers as well as AlGaAs guide layers. The semiconductor laser device of this embodiment results from replacing InGaP by $GaAs_{0.72}P_{0.28}$ for the barrier layers 26 in the semiconductor laser device of the foregoing first embodiment, where the constitution except for the barrier layers and the manufacturing method are unchanged. Therefore, FIG. 1 for the fourth embodiment is used as it is in the following description.

Regarding the $GaAs_{0.72}P_{0.28}$ barrier layers 26, the strain is −1% in tensile strain and the layer thickness is 8 nm for each of the layers 26a and 26c, and 7 nm for the layer 26b. Eg of $GaAs_{0.72}P_{0.28}$ can be calculated as about 1.77 eV without consideration of strain. It is noted that influences of the tensile strain on Eg are not taken into consideration here because such influences are unclear as far as vicinities of the mole fractions of this material are concerned. The well layers 27 are formed of $In_{0.162}Ga_{0.838}As_{0.671}P_{0.329}$, with Eg being 1.57 eV, and there holds a lattice matching with the substrate, and the layer thickness is 5 nm for each of the layers 27a and 27b each being 5 nm. It is noted that |ΔEg| between the well layers 27 and the barrier layers 26 is 0.20 eV. Also, Eg of the guide layers 24, 28 is 1.86 eV.

After subjecting the obtained semiconductor laser device to cleaving at a resonator length of 800 μm, application of end-face reflective coating, and mounting onto a stem, device characteristics were measured. As a result, the semiconductor laser device showed a threshold current of Ith=25 mA and a temperature characteristic of T0=140K. Thus, the semiconductor laser device using the GaAsP barrier layers with a tensile strain introduced therein is capable of remarkably improving the device characteristics in spite of a small ΔEg of 0.20 eV, compared with the semiconductor laser device of the first embodiment having InGaP barrier layers.

(Advantages of GaAsP Barrier Layers, and Advantages of Use of AlGaAs Guide Layers in Combination)

FIG. 2C shows an energy band of the active region and its vicinities in the semiconductor laser device of this embodiment. In the case of the semiconductor laser device having InGaP barrier layers in the first embodiment, it can be understood that a very large barrier is formed on the Ev side against holes flowing from the guide layers 24, 28 to the well layers 27, as can be seen also from the energy band shown in FIG. 2A. On the other hand, in the semiconductor laser device of GaAsP barrier layers in this embodiment, no barrier against the holes flowing from the guide layers to the well layers is present on the Ev side. In FIGS. 4 and 7, the GaAsP composition of the barrier layers in this embodiment is shown by ▲. Since |ΔEc0|/|ΔEg0| of GaAsP can be estimated as about 0.60 as stated before, |ΔEv0| can be made much smaller, compared with InGaP, as can be seen from FIG. 6. Accordingly, using GaAsP instead of InGaP for the barrier layers allows ΔEv between the well layer and the barrier layer to be made smaller as well, so that the injection of holes into the well layers can be greatly improved.

Therefore, it can be presumed that, according to this embodiment, carrier injection of both electrons and holes was performed efficiently, leading to a reduction in threshold current.

Also, it can be understood that in the semiconductor laser device with the GaAsP barrier layers, although the value of Eg is smaller than that of the semiconductor laser device with the InGaP barrier layers, yet the value of |ΔEc|, which is a difference in Ec between the well layer and the barrier layer, is larger than that, conversely. Thus, it can be presumed that, because of an increase in |ΔEc| obtained by providing a barrier layer of GaAsP, the overflow of electrons was more suppressed, which led to a further decrease in the threshold current and a further increase in the differential efficiency, as well as an improvement in the temperature characteristic.

As can be seen from FIGS. 4 and 5, |ΔEc0| of the GaAsP barrier layers can be estimated as about 0.21 eV for the composition of $GaAs_{0.72}P_{0.28}$. Accordingly, since |ΔEc0| of the InGaAsP well layers 27 is about 0.03 eV as stated before, |ΔEc| between the well layer and the barrier layer results in about 0.18 eV (=0.21 eV−0.03 eV). This resulting value has a magnitude equivalent to that of the 780 nm band semiconductor laser device having AlGaAs well layers. However, although the GaAsP barrier layer, having a tensile strain of −1%, can be formed thin on both sides of the well layer, forming the guide layer of the same material at a thickness of several tens nm would cause occurrence of defects. Therefore, for the guide layer, there is a need for using a material that provides lattice matching with the GaAs substrate and that allows ΔEc to be set large. From these and other reasons, it is effective to use AlGaAs as the guide layer as in this embodiment.

If InGaAsP having lattice matching with the GaAs substrate was used as the guide layer, |ΔEc| between the well layer and the guide layer would result in a small value as can be seen also from FIG. 8. Although |ΔEc| between well layer and barrier layer would be large enough, the barrier layer is so thin in thickness that electrons would early overflow, making it impossible to obtain successful characteristics.

The $Al_{0.35}Ga_{0.65}As$ guide layers 24, 28 in the semiconductor laser device of this embodiment have a |ΔEc0| value of about 0.26 eV, which can be estimated to be even higher than that of the barrier layers. Therefore, quite a high effectiveness for the suppression of carrier overflow can be obtained, so that the temperature characteristic T0 can be improved.

By way of comparison, in the case of the AlGaAs-based semiconductor laser device, when $Al_{0.35}Ga_{0.65}As$ is used for the barrier layer and the guide layer, ΔEc between the well layer and the barrier layer/guide layer is estimated to be about 0.18 eV. That is, even with $Al_{0.35}Ga_{0.65}As$ used similarly, the present embodiment provides a larger ΔEc between the well layer and the guide layer. This is an effect produced by using InGaAsP for the well layer, as described also in connection with the first embodiment.

(Determination of Effective Range for GaAsP Barrier Layer)

In this second embodiment, $GaAs_{0.72}P_{0.28}$ is used for the barrier layers for improvement of characteristics over the first embodiment. In this case, using GaAsP and InGaAsP of appropriate mole fraction ranges for the barrier layers allows a sufficient effect to be obtained.

Now, upper limits and lower limits of |ΔEc0| and |ΔEv0| that allow InGaAsP to effectively function as a barrier layer will be described below. Considering that holes are dominant in carrier injection into the well layer, |ΔEv0| is set so as not to be larger than necessary. Also, considering that electrons are dominant in carrier overflow from the well layer, |ΔEc0| is set so as not to be smaller than necessary. In addition, in the InGaAsP well layer in the semiconductor laser device having an oscillation wavelength of 780 nm, it is presumed that |ΔEc0|=approx. 0.03 eV and |ΔEv0|=approx. 0.12 eV. However, these values are not precise because they vary depending on the strain quantity of the well layer or the like.

First, as to the minimum value of |ΔEv0|, ΔEv between the barrier layer and the well layer needs to become at least a positive value. Therefore, |ΔEv0|>approx. 0.12 eV, and it can be said from FIG. 6 that there is a boundary for |ΔEv0| in the vicinity of P mole fractions of 0.15 to 0.30.

Next, the maximum value of |ΔEv0| needs to be suppressed to such an extent that the injection of holes from the guide layers is not blocked. Whereas various types of materials or compositions to be lattice-matched with the GaAs substrate, such as InGaP or AlGaAs, are used for guide layers or clad layers, the value of |ΔEv0| at least needs to be smaller than in the case where InGaP involving the largest |ΔEv0| is used, and it results that |ΔEv0| is smaller than approx. 0.38 eV (a value of |ΔEv0| at an intersecting point between the broken line indicating that the strain quantity for GaAs is 0 and the line of InGaP in FIG. 6). Accordingly, it can be said from FIG. 6 that there is a boundary of |ΔEv0| in the vicinity of P mole fractions of 0.60 to 0.80.

Also, the minimum value of |ΔEc0| needs to be set so that ΔEc between the barrier layer and the well layer becomes about 0.12 eV or more, in order to prevent the overflow of electrons from the well layer. This value of 0.12 eV corresponds to a case where AlGaAs having a group-III Al mole fraction of about 0.27 is used as the barrier layer in an AlGaAs-based semiconductor laser device. Therefore, since |ΔEc0| of the well layers is approx. 0.03 eV, |ΔEc0| of the barrier layers is larger than approx. 0.15 eV (=approx. 0.03 eV+0.12 eV). As can be seen from FIGS. 5 and 7, the lines of constant Ec values are nearly parallel to the lines of constant lattice constants, and therefore the boundary for |ΔEc0| can be set by a value of difference of a strain quantity against GaAs of the barrier layers from a strain quantity of the well layers against GaAs. That is, it can be said that there is a boundary of |ΔEc0| in the vicinity of points where the difference in strain quantity from the well layers is −0.65% to −0.85%

By the presence of the AlGaAs guide layers 24, 28, the semiconductor laser device of this embodiment is so structured as to be free from any problem in terms of carrier overflow from the guide layers 24, 28 to the outside. However, increasing the ΔEc between the barrier layers 26 and the well layers 27 as described above makes it possible to suppress the overflow of more than necessary amounts of carriers to the layers containing Al, so that even higher reliability can be obtained as compared with the case of the first embodiment.

Next, the maximum value of |ΔEc0| is not particularly taken into consideration based on a reckoning that electron injection would not be affected very much unless a very large barrier is involved.

As shown above, according to the results of measurement of characteristics on semiconductor laser devices using several types of barrier layers that were actually fabricated based on the roughly estimated P mole fractions and the boundary of strain quantity, it follows that a range of P mole fractions larger than 0.2 and smaller than 0.75 for the barrier layers is effective. Further, a range of P mole fractions larger than 0.25 and smaller than 0.6 allows quite effective device characteristics to be obtained. Also, setting the difference in strain quantity of the barrier layers from the well layers to −0.65% or less would cause the device characteristics to be deteriorated. Therefore, an effective range of the difference of strain quantity of the barrier layers from the strain quantity of the well layers is larger than −0.65%.

It is noted that the aforementioned estimate values of |ΔEg0|, |ΔEc0| and |ΔEv0| are not necessarily true values, since changes in band structure due to strain are not taken into consideration because of the absence of definite data. Nevertheless, the ranges described above have been obtained from the results of discussions on the characteristics of semiconductor laser devices that were actually fabricated by referencing those estimations. Therefore, the above ranges are not conditioned on whether those estimations are true or not.

(High Reliability by Being Al-Free)

This embodiment, in which no Al is contained in the well layers 27 nor the barrier layers 26 adjacent to the well layers 27, is capable of achieving high reliability even at high-temperature, high-power state. Also, adding In to the barrier layers 26 to form InGaAsP barrier layers makes it possible to achieve even higher reliability. The reason of this could be that the element In suppresses the growth of dislocation.

Further, in the second embodiment, outside the outermost barrier layers 26a, 26c in the active region are the guide layers 24, 28 of AlGaAs. Due to this, 4 nm or less thicknesses of the GaAsP barrier layers 26 would cause a decrease in reliability at a high-temperature, high-power state. This could be attributed to an influence of Al of the guide layers 24, 28. Accordingly, making the thickness of the GaAsP barrier layers 26 larger than 4 nm makes it possible to suppress the influence of Al of the guide layers 24, 28 to a large extent, so that high reliability can be obtained even at a high-temperature, high-power state.

(Advantages of InGaAsP Well Layer regarding Ec and Ev)

As can be seen from FIG. 3, Eg of the InGaAsP well layers 27 extends toward the valence band side, as compared with the GaAs substrate 21, so that $|EcO|<|\Delta EvO|$. In contrast to this, Eg of the GaAsP barrier layers 26 extends toward the conduction band side so that $|\Delta EcO|>|\Delta EvO|$. Accordingly, in regard to $\Delta Ec$ and $\Delta Ev$ between the well layer 27 and the barrier layer 26, a combination of the InGaAsP well layers 27 and the GaAsP barrier layers 26 makes it possible to make the $|\Delta EcO|$ even larger and the $|\Delta EvO|$ even smaller, as compared with the case where, for example, AlGaAs is adopted for the well layers. That is, according to this embodiment, it becomes possible to enlarge $|\Delta EcO|$ while $|\Delta EvO|$ remains small by using the barrier layers of a small Eg. As a result, the overflow of electrons can be suppressed by enlarging $|\Delta EvO|$ between the well layers 27 and the barrier layers 26, thereby making it possible to achieve lower threshold current, higher differential efficiency and higher temperature characteristics.

(Influence of Tensile-Strained Barrier Layer on Strain-Free Well Layer)

In the second embodiment, InGaAsP lattice-matched with the GaAs substrate 21 is used for the well layers 27. In this case, the well layers 27 are also subject to influences of strain by the influence of tensile strain of the barrier layers 26 that are present on both sides. Accordingly, whereas strain is introduced to the well layers in common cases, it becomes achievable, in this embodiment, to obtain the effect of strain without actually introducing the strain to the well layers 27, thus allowing lower threshold current and higher power to be obtained.

Also, the semiconductor laser device in this embodiment performs TM mode oscillation. It is known that the emission of the tensile-strain layer results in the TM mode emission with the light hole band contributing to the light emission. In the InGaAsP well layers 27 of this embodiment, which are indeed identical in lattice constant with the GaAs substrate 21, but the emission results in the TM mode as a result of the addition of tensile-strain energy under the influence of the tensile strain of the GaAsP barrier layers 26. Generally, in the case of the TM mode with tensile strain given into the well layers, if the barrier layer has a tensile strain as well, a total strain quantity of the active region would be quite large, causing a deterioration of reliability. By contrast, in this embodiment, in which strain-free well layers are used, the strain quantity as the whole of the active region can be suppressed, so that a semiconductor laser device of TM mode capable of satisfying high device characteristics and high reliability at the same time can be obtained.

Although the TM mode is selected in this embodiment as described above, it is also possible to select the TE mode by reducing the tensile-strain quantity of the barrier layers or providing the well layers with compressive strain or other means.

As described above, in the second embodiment, the composition of the barrier layers 26 in the semiconductor laser device of the first embodiment is changed from InGaP to $GaAs_{0.72}P_{0.28}$ with a strain quantity of −1% introduced therein, thus providing a semiconductor laser device having a quantum well active region of InGaAsP well layers and GaAsP barrier layers, and AlGaAs guide layers. Like this, the barrier layers 26 are formed of a GaAsP having a P mole fraction larger than 0.2 and smaller than 0.75 and having a strain-quantity difference of more than −0.65% from the strain quantity of well layers (=strain quantity of substrate), and further the barrier layers 26 are combined with the InGaAsP well layers 27. As a result of this, $|\Delta EvO|$ of the barrier layers 26, the well layers 27 and the guide layers 24, 28 can be set so as to meet a relationship of magnitude that $|\Delta EvO|$ of well layers $27<|\Delta EvO|$ of barrier layers $26<|\Delta EvO|$ of guide layers 24, 28, thus making it possible to efficiently achieve the injection of holes from the guide layers 24, 28. Moreover, $\Delta Ec$ between the barrier layers 26 and the well layers 27 is settable to 0.12 eV or more, so that the overflow of electrons from the well layers 27 is suppressed.

Thus, as compared with the case using the InGaP barrier layers, the device characteristics are remarkably improved to a threshold current of Ith=25 mA and a temperature characteristic of T0=140K, in spite of $\Delta Eg$ between the well layer 27 and the barrier layer 26 as small as 0.20 eV.

(Degree of Freedom for Various Constitutions)

Although the InGaAsP well layers 27 have been set to the same lattice constant as that of the GaAs substrate 21 in this embodiment, yet the GaAsP barrier layers 26 are also effective even if strain is applied to the InGaAsP well layers 27, in which case an improvement in device characteristics would result. Further, although the number of wells is two in layers in this embodiment, this is not limitative and similar effects can be obtained with any arbitrary number of wells. Furthermore, although this embodiment has been provided in a buried ridge structure, this is not limitative and similar effects can be obtained with any structure such as a ridge structure, an internal stripe structure and a buried heterostructure.

Still also, although an n-type substrate has been used as the substrate in this embodiment, similar effects can be obtained even if a p-type substrate is used and moreover the n-type and p-type of the individual layers are reversed. Further, although a wavelength of 780 nm has been adopted, this is not limitative and similar effects can be obtained only if the wavelength falls within a so-called 780 nm band covering a range of larger than 760 nm and smaller than 800 nm.

Third Embodiment

Figure 9:
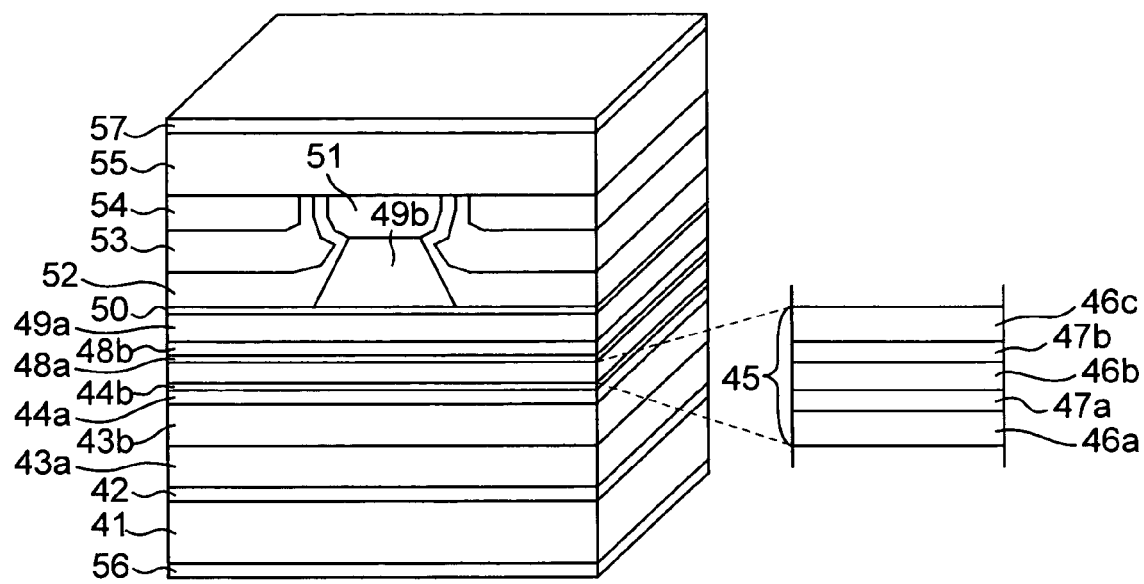
FIG. 9 shows the structure of a semiconductor laser device other than that of FIG. 1.

FIG. 9 shows the structure of a semiconductor laser device according to a third embodiment. This embodiment relates to a semiconductor laser device with a wavelength of 780 nm having an InGaAsP compressively strained well layer/InGaAsP barrier layer quantum well active region and AlGaAs guide layers.

FIG. 9 shows an n-type GaAs substrate 41, an n-type GaAs buffer layer (layer thickness: 0.5 μm) 42, an n-type $Al_{0.4}Ga_{0.6}As$ lower second clad layer (layer thickness: 3.0 μm) 43a, an n-type $Al_{0.5}Ga_{0.5}As$ lower first clad layer (layer thickness: 0.2 μm) 43b, an $Al_{0.42}Ga_{0.58}As$ lower second guide layer (layer thickness: 70 nm) 44a, an $Al_{0.32}Ga_{0.68}As$ lower first guide layer (layer thickness: 10 nm) 44b, and an active region 45. In this case, the active region 45 has a DQW structure composed of barrier layers 46 and well layers 47. There are also shown an $Al_{0.32}Ga_{0.68}As$ upper first guide layer (layer thickness: 10 nm) 48a, an $Al_{0.42}Ga_{0.58}As$ upper second guide layer (layer thickness: 70 nm) 48b, a p-type $Al_{0.5}Ga_{0.5}As$ first upper clad layer (layer thickness: 0.2 μm) 49a, a p-type GaAs etching stopper layer (layer thickness: 3 nm) 50, a ridge-stripe shaped p-type $Al_{0.5}Ga_{0.5}As$ second upper clad layer (layer thickness: 1.28 μm) 49b, a p-type GaAs protective layer (layer thickness: 0.7 μm) 51, an n-type $Al_{0.7}Ga_{0.3}As$ first current blocking layer (layer thickness: 0.6 μm) 52, an n-type GaAs second current blocking layer (layer thickness: 0.7 μm) 53, a p-type GaAs buried protective layer (layer thickness: 0.6 μm) 54, a p-type GaAs cap layer (layer thickness: 2 μm) 55, an n-side electrode 56, and a p-side electrode 57.

The barrier layers 46 are formed of $In_{0.126}Ga_{0.874}As_{0.407}P_{0.593}$, where Eg is 1.98 eV, the strain is −1.20% in tensile strain and the layer thickness is 10 nm for each of the layers 46a and 46c and 5 nm for the layer 46b. The well layers 47 are formed of $In_{0.27}Ga_{0.73}As_{0.55}P_{0.45}$, where Eg is 1.55 eV, the strain is 0.35% in compressive strain and the layer thickness is 8 nm for each of the layers 47a and 47b. It is noted that $|\Delta Eg|$ between the well layers 47 and the barrier layers 46 is 0.43 eV.

Eg of the guide layers 44b, 48a is 1.82 eV, and Eg of the guide layers 44a, 48b is 1.95 eV. It is noted that the influence of the strain on Eg of the barrier layers 46 and the well layers 47 is not taken into consideration in this embodiment as well because such influence is unclear also with respect to the compositions of the materials used in this embodiment.

The semiconductor laser device with the above-described InGaAsP compressive-strain well layer/InGaAsP barrier layer/AlGaAs guide layer structure can be fabricated by forming a buried ridge structure with a stripe width of 2 μm by the crystal growth techniques and procedures similar to those used in the first embodiment. Then, after subjecting the thus obtained semiconductor laser device to cleaving at a resonator length of 800 μm, application of end-face reflective coating and mounting onto a stem, device characteristics were measured. As a result, the semiconductor laser device showed a threshold current of Ith=30 mA and a temperature characteristic of T0=153K. Thus, the semiconductor laser device having the well layers with a compressive strain introduced therein and using the InGaAsP barrier layers can also obtain successful device characteristics.

Figure 10:
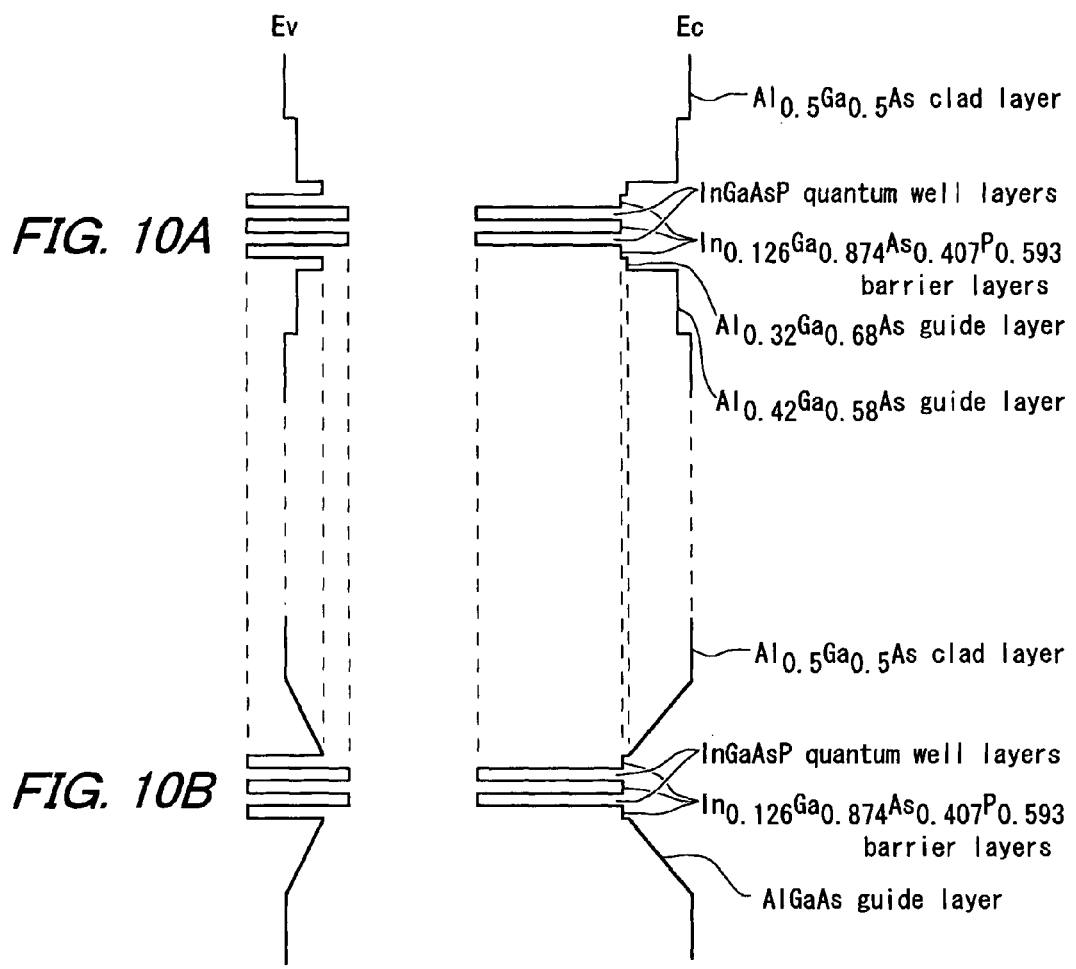
FIGS. 10A and 10B show energy bands of the active region and its vicinity in the semiconductor laser device shown in FIG. 9 and in a modified semiconductor laser device, respectively.

FIG. 10A shows an energy band of the active region and its vicinity in the semiconductor laser device of this third embodiment. In this semiconductor laser device, each of the AlGaAs guide layers 44, 48 is formed in a two-layer structure. Further, for the guide layers 44b, 48a closer to the well layers 47, the Al mole fraction is made 0.32, which is smaller then that of the guide layers 24, 28 of the foregoing first and second embodiments. Like this, the Al mole fraction in the region close to the well layers 47 that are light-emitting layers are made small, by which the reliability is further improved. Meanwhile, the Al mole fraction of the guide layers 44a, 48b farther from the well layers 47 is set to 0.42, which larger than that of the guide layers 24, 28 of the first and second embodiments, so that $|\Delta Ec0|$ and $|\Delta Ev0|$ go larger in the order from the well layers 47 side toward the clad layers 43, 49 side. Accordingly, the overflow of carriers can be suppressed within the guide layers 44, 48, so that a temperature characteristic T0 generally equal to that of the semiconductor laser device of the second embodiment can be obtained.

In this semiconductor laser device, since the barrier layers 46 are formed of InGaAsP having a P mole fraction of smaller than 0.60, $|\Delta Ec|$ between the well layers 47 and the barrier layers 46 can be increased while $|\Delta Ev0|$ remains small, as compared with the semiconductor laser device of the first embodiment using InGaP for the barrier layers.

As can be seen from FIGS. 5 and 6, around the mole fractions of the barrier layers 46 of this semiconductor laser device, the way the lines of constant Ec values vary with mole fractions largely differs from the way the lines of constant Ev values vary with mole fractions. Therefore, selecting appropriate mole fractions will make it possible to control $|\Delta Ec0|$ and $|\Delta Ev0|$ of the barrier layers 46 independently from each other to some extent. For example, since the lines of constant Ec values are generally parallel to the lines of constant lattice constants, it is also possible to change Ev while Ec and strain quantity of the barrier layers 46 are kept almost unchanged. In this embodiment, the In mole fraction and the P mole fraction are adjusted so that $|\Delta Ev0|$ between the well layers 47 and the barrier layers 46 becomes larger as compared with that of the semiconductor laser device of the second embodiment. As a result of this, it also becomes possible to improve the confinement of holes into the well layers 47.

Also, in this embodiment, an InGaAsP having a compressive strain of 0.35% is used for the well layers 47, so that a strain effect for lower threshold current can be obtained. In this connection, the quantum well active region has a strain compensation structure composed of the well layers 47 with a compressive strain introduced therein and the barrier layers 46 with a tensile strain of −1.20% introduced therein. Therefore, an average strain quantity of the whole active region can be suppressed, so that the quantity of defects within crystals can be reduced as compared with the case where the well layers are held in lattice matching with the substrate, thus allowing a further improvement in reliability to be achieved. Also, as a result of the reduction in average strain quantity, the critical layer thickness of the whole quantum-well-layer active region is increased, whereby the barrier layers 46a, 46b are each set to as large a layer thickness as 10 nm, compared with 8 nm of the second embodiment. Further, since the distance from the well layers 47 to the corresponding AlGaAs guide layers 44, 48 is set to as large as 10 nm, the influence of Al in the guide layers 44, 48 on the active region can be further reduced, which allows high reliability to be obtained even at a high-temperature, high-power state. Furthermore, in this embodiment, since the barrier layers 46 are provided by In-added layers of InGaAsP, it has become possible to obtain even higher reliability by suppressing the growth of dislocations by virtue of In.

It is noted that the guide layers 44, 48 in the semiconductor laser device of the above constitution are two-layer structured, so that the Al mole fraction is increased in two steps from the quantum-well active region side to the clad layers 43, 49 side. However, alternatively, the Al mole fraction may also be increased continuously from the quantum-well active region side to the clad layers 43, 49 side. An example of the energy band in such a case is shown in FIG. 10B. In FIG. 10B, the Al mole fraction of the AlGaAs guide layers 44, 48 is increased from 0.32 to 0.5, the latter value being equal to the Al mole fraction of the clad layers 43b, 49. In this case, also, the overflow of carriers can be suppressed sufficiently.

However, the Al mole fraction of the guide layers 44, 48 in that case is, desirably, made smaller than 0.4 at least for the portions adjacent to the barrier layers 46. This is because higher Al mole fractions in vicinities of the well layers 47 would adversely affect the reliability.

In this embodiment, the active region is provided by the combined InGaAsP compressive-strained well layers and InGaAsP tensile-strained barrier layers. However, the active region is not limited to this combination. It is also possible to adopt a combination of InGaAsP strain-free well layers and InGaAsP tensile-strained barrier layers, a combination of InGaAsP compressive-strain well layers and GaAsP barrier layers, etc. Further, although the number of well layers in this embodiment is two, this is not limitative and similar effects can be obtained with any arbitrary number of well layers. Furthermore, although this embodiment has been provided in a buried ridge structure, this is not limitative and similar effects can be obtained with any structure such as a ridge structure, an internal stripe structure and a buried heterostructure.

Still also, although an n-type substrate has been used as the substrate in this embodiment, similar effects can be obtained even if a p-type substrate is used and moreover the n-type and p-type of the individual layers are reversed. Further, although a wavelength of 780 nm has been adopted, this is not limitative and similar effects can be obtained only if the wavelength falls within a so-called 780 nm band which covers a range of larger than 760 nm and smaller than 800 nm.

Fourth Embodiment

Figure 11:
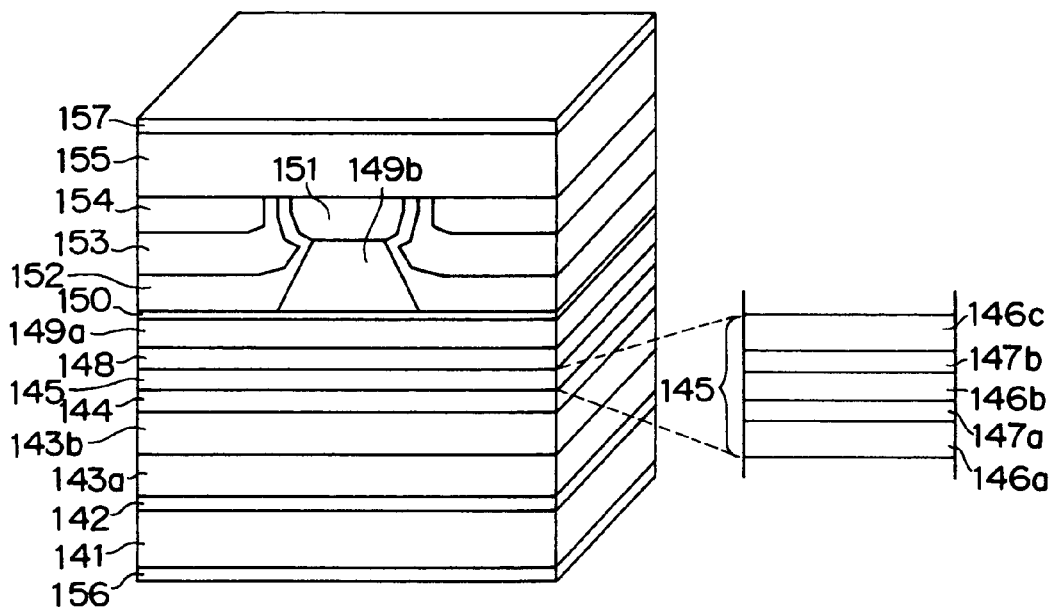
FIG. 11 shows the structure of a semiconductor laser device different from the devices of FIGS. 1 and 9.

FIG. 11 shows the structure of a semiconductor laser device according to a fourth embodiment. This embodiment relates to a semiconductor laser device with a wavelength of 780 nm having an InGaAsP compressively strained well layer/InGaAsP barrier layer quantum well active region.

FIG. 11 shows an n-type GaAs substrate 141, an n-type GaAs buffer layer (layer thickness: 0.5 µm) 142, an n-type $Al_{0.4}Ga_{0.6}As$ lower second clad layer (layer thickness: 3.0 µm) 143a, an n-type $Al_{0.5}Ga_{0.5}As$ lower first clad layer (layer thickness: 0.2 µm) 143b, an $Al_{0.42}Ga_{0.58}As$ lower guide layer (layer thickness: 0.1 µm) 144, and an active region 145. In this case, the active region 145 has a DQW structure composed of barrier layers 146 and well layers 147. There are also shown an $Al_{0.42}Ga_{0.58}As$ upper guide layer (layer thickness: 0.1 µm) 148, a p-type $Al_{0.5}Ga_{0.5}As$ first upper clad layer (layer thickness: 0.2 µm) 149a, a p-type GaAs etching stopper layer (layer thickness: 3 nm) 150, a ridge-stripe shaped p-type $Al_{0.5}Ga_{0.5}As$ second upper clad layer (layer thickness: 1.28 µm) 149b, a p-type GaAs protective layer (layer thickness: 0.7 µm) 151, an n-type $Al_{0.7}Ga_{0.3}As$ first current blocking layer (layer thickness: 0.6 µm) 152, an n-type GaAs second current blocking layer (layer thickness: 0.7 µm) 153, a p-type GaAs buried protective layer (layer thickness: 0.6 µm) 154, a p-type GaAs cap layer (layer thickness: 2 µm) 155, an n-side electrode 156, and a p-side electrode 157.

The barrier layers 146 are formed of $In_{0.09}Ga_{0.91}As_{0.41}P_{0.59}$, where Eg is 2.02 eV, the strain is −1.45% in tensile strain and the layer thickness is 10 nm for each of the layers 146a and 146c and 5 nm for the layer 146b. The well layers 147 are formed of $In_{0.27}Ga_{0.73}As_{0.55}P_{0.45}$, where Eg is 1.55 eV, the strain is 0.35% in compressive strain and the layer thickness is 8 nm for each of the layers 147a and 147b. It is noted that |ΔEg| between the well layers 147 and the barrier layers 46 is 0.47 eV.

The influence of the strain on Eg of the barrier layers 146 and the well layers 147 is not taken into consideration in this embodiment as well because such influence is unclear also with respect to the compositions of the materials used in this embodiment.

The semiconductor laser device with the above-described InGaAsP compressive-strain well layer/InGaAsP barrier layer structure can be fabricated by forming a buried ridge structure with a stripe width of 2 µm by the crystal growth techniques and procedures similar to those used in the first embodiment. Then, after subjecting the thus obtained semiconductor laser device to cleaving at a resonator length of 800 µm, application of end-face reflective coating and mounting onto a stem, device characteristics were measured. As a result, the semiconductor laser device showed a threshold current of Ith=29 mA, a differential efficiency ηd=0.95 W/A, and a temperature characteristic of T0=150K. Thus, the semiconductor laser device having the well layers with a compressive strain introduced therein and using the InGaAsP barrier layers can also obtain successful device characteristics.

Figure 12:
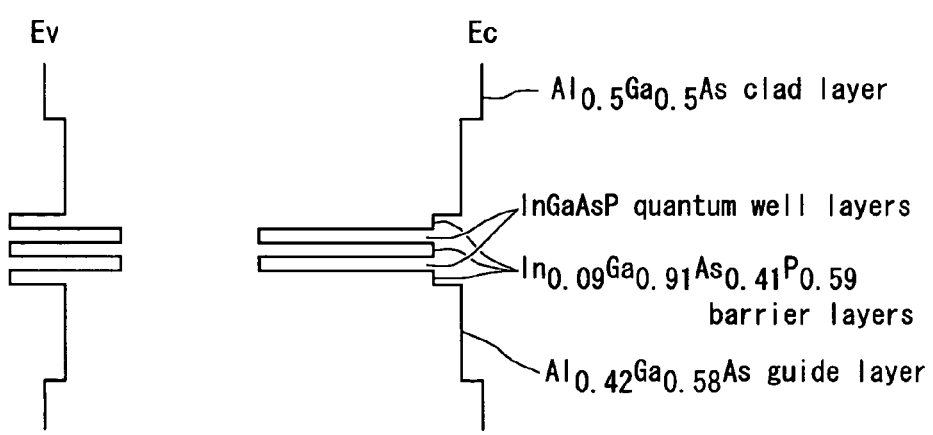
FIG. 12 shows an energy band of the active region and its vicinity in the semiconductor laser device shown in FIG. 11.

FIG. 12 shows an energy band of the active region and its vicinity in the semiconductor laser device of this fourth embodiment. In this semiconductor laser device as well, since the barrier layers 146 are formed of InGaAsP having a P mole fraction of smaller than 0.60, |ΔEc| between the well layers 147 and the barrier layers 146 can be increased while |ΔEv| remains small, as in the semiconductor laser device of the third embodiment.

Also, in the fourth embodiment as well, the In mole fraction and the P mole fraction are adjusted so that |ΔEv| between the well layers 147 and the barrier layers 146 becomes larger as compared with that of the semiconductor laser device of the second embodiment. As a result of this, it also becomes possible to improve the confinement of holes into the well layers 147.

In the fourth embodiment, as can be seen from the comparison between FIG. 12 and FIGS. 2A and 2B, the valence band barrier is set smaller, compared with the semiconductor laser device using InGaP for the barrier layers. Accordingly, the carrier injection efficiency for both electrons and holes is largely improved also in this embodiment, which is effective for improvement in device characteristics. Further, since the well layers 147 and the barrier layers 146 adjacent thereto contain no Al, high reliability can be obtained even at a high-temperature, high-power state.

Further, in this embodiment, the InGaAsP barrier layers 146 have a tensile strain of −1.45% with the lattice constant shifted from that of the GaAs substrate 141. However, by introducing a compressive strain to the well layers 147, an average strain quantity of the whole active region is controlled, so that the quantity of defects within crystals can be reduced, thus allowing a further improvement in reliability to be achieved, as compared with the case where the well layers are provided in lattice matching with the substrate. Also, as a result of the reduction in average strain quantity, the critical layer thickness of the whole active region is increased, whereby the barrier layers 146a, 146b are each set to as large a layer thickness as 10 nm. Whereas the guide layers 144, 148 of AlGaAs are outside the outermost barrier layers 146a, 146c in the active region also in this embodiment, yet the distance from the well layers 147 to the corresponding AlGaAs guide layers 144, 148 is set to as large as 10 nm, so that the influence of Al of the guide layers 144, 148 on the active region can be further reduced, thus allowing high reliability to be obtained even at a high-temperature, high-power state. Furthermore, in the fourth embodiment, since the barrier layers 146 are provided by the In added layers of InGaAsP, it has become possible to obtain even higher reliability by suppressing the growth of dislocations by virtue of In.

In this embodiment, since InGaAsP having a compressive strain of 0.35% is used for the well layers 147, a strain effect can be obtained. Therefore, it becomes achievable to obtain lower threshold current and higher power. In addition, it is known that since the heavy hole band contributes to the emission of the compressive-strain layer, the polarization mode results in the TE mode. The polarization mode of the semiconductor laser device in this embodiment is also TE mode. This proves that a semiconductor laser device of the TE mode can be formed by giving a compressive strain to the well layers 147.

In this embodiment, the active region is provided by the combined InGaAsP compressive-strained well layers and InGaAsP tensile-strained barrier layers. However, the active region is not limited to this combination. It is also possible to adopt a combination of InGaAsP strain-free well layers and InGaAsP tensile-strained barrier layers, a combination of InGaAsP compressive-strained well layers and GaAsP barrier layers, etc. Further, although the number of well layers in this embodiment is two, this is not limitative and similar effects can be obtained with any arbitrary number of well layers, such as one. Furthermore, although this embodiment has been provided in a buried ridge structure, this is not limitative and similar effects can be obtained with any structure such as a ridge structure, an internal stripe structure and a buried heterostructure.

Still also, although an n-type substrate has been used as the substrate in this embodiment, similar effects can be obtained even if a p-type substrate is used and moreover the n-type and p-type of the individual layers are reversed. Further, although a wavelength of 780 nm has been adopted, this is not limitative and similar effects can be obtained only if the wavelength falls within a so-called 780 nm band which covers a range of larger than 760 nm and smaller than 800 nm.

Fifth Embodiment

Figure 13:
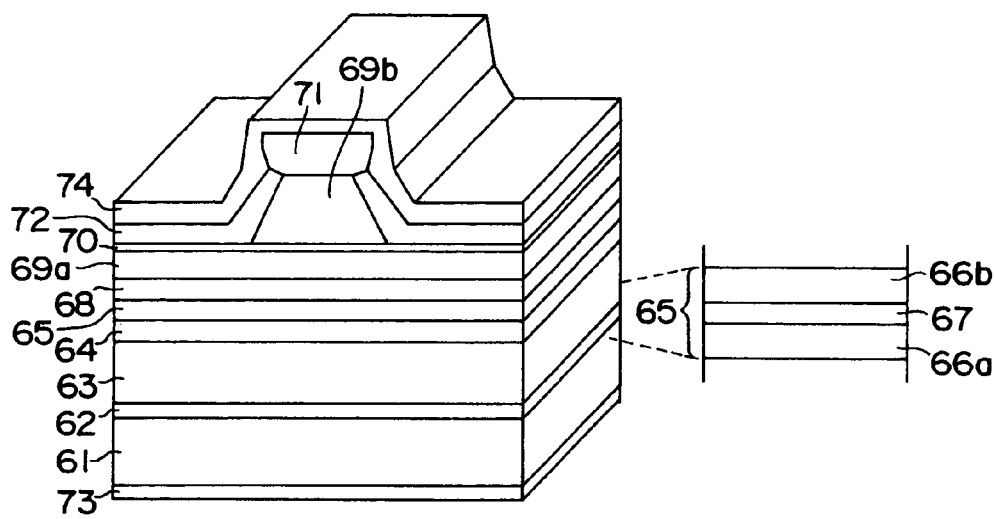
FIG. 13 shows the structure of a semiconductor laser device different from the devices of FIGS. 1, 9 and 11.

FIG. 13 shows the structure of a semiconductor laser device according to a fifth embodiment. This embodiment relates to a semiconductor laser device with a wavelength of 780 nm having an InGaAsP well layer/GaAsP barrier layer quantum well active region.

FIG. 13 shows an n-type GaAs substrate 61, an n-type GaAs buffer layer (layer thickness: 0.5 μm) 62, an n-type $(Al_{0.5}Ga_{0.5})_{0.516} In_{0.484}P$ lower clad layer (layer thickness: 1.7 μm) 63, a $Ga_{0.516}In_{0.484}P$ lower guide layer (layer thickness: 50 nm) 64, and an active region 65. In this case, the active region 65 has a SQW structure composed of barrier layers 66 and a well layer 67. There are also shown a $Ga_{0.516}In_{0.484}P$ upper guide layer (layer thickness: 50 nm) 68, a p-type $(Al_{0.5}Ga_{0.5})_{0.516}In_{0.484}P$ first upper clad layer (layer thickness: 0.2 μm) 69a, a p-type GaAs etching stopper layer (layer thickness: 3 nm) 70, a ridge-stripe shaped p-type $(Al_{0.5}Ga_{0.5})_{0.516} In_{0.484}P$ upper second clad layer (layer thickness: 1.28 um) 69b, a p-type GaAs protective layer (layer thickness: 1.0 μm) 71, an $SiN_x$ current blocking layer 72, an n-side electrode 73, and a p-side electrode 74.

The barrier layers 66 are formed of $GaAs_{0.75}P_{0.25}$ in which Eg is 1.73 eV, the strain is −0.89% in tensile strain and the layer thickness is 5 nm for each of the layers 66a and 66b. The well layer 67 is formed of $In_{0.27}Ga_{0.73}As_{0.55}P_{0.45}$, in which Eg is 1.55 eV, the strain is 0.35% in compressive strain and the layer thickness is 8 nm. It is noted that ΔEg between the well layer 67 and the barrier layer 66 is 0.18 eV. It is also noted that the influence of strain on Eg of the barrier layers 66 and the well layer 67 is unclear also with respect to the mole fractions of the materials used for those layers, and is not taken into consideration in this embodiment.

The semiconductor laser device with the above InGaAsP well layer/GaAsP barrier layer structure is fabricated in the following manner. First, a ridge stripe portion is formed by the crystal growth techniques and procedures similar to those in the first embodiment. Then, a $SiN_x$ current blocking layer 72 is grown on the whole ridge stripe portion including its upper side and both lateral sides by plasma vapor deposition process. In this process, on the ridge stripe portion, the current blocking layer 72 is formed in a protrusive shape reflecting the shape of the ridge stripe portion.

Next, a resist mask is formed over the current blocking layer 72 except for a region corresponding to the protective layer 71 in the protrusive-shaped portion. Then, the current blocking layer 72 around the protective layer 71 in the protrusive-shaped portion is removed by etching, thereby making a top portion of the ridge stripe portion exposed. Finally, an n-side electrode 73 is formed on the surface of the substrate 61, and a p-side electrode 74 is formed on the surfaces of the current blocking layer 72 and the protective layer 71. In this way, the semiconductor laser device having the InGaAsP well layer/GaAsP barrier layer active region and a ridge waveguide structure whose stripe width is 3 μm is formed.

Then, after subjecting the obtained semiconductor laser device to cleaving at a resonator length of 800 μm, application of end-face reflective coating and mounting onto a stem, device characteristics were measured. As a result, the semiconductor laser device of this embodiment showed a threshold current of Ith=30 mA, a differential efficiency of ηd=0.9 W/A and a temperature characteristic of T0=130K. Thus, the semiconductor laser device using the GaAsP barrier layer and having a ridge waveguide structure can obtain successful device characteristics in spite of a very small ΔEg of 0.18 eV.

Figure 14:
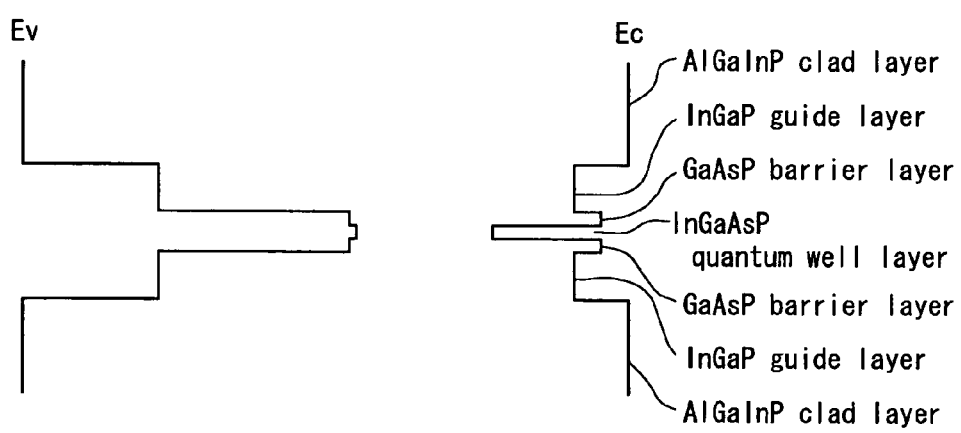
FIG. 14 shows an energy band of the active region and its vicinity in the semiconductor laser device shown in FIG. 13.

FIG. 14 shows an energy band of the active region and its vicinity in the semiconductor laser device of this embodiment. In this semiconductor laser device also, as in the semiconductor laser device of the second embodiment, since the barrier layers 66 are formed of GaAsP having a P mole fraction smaller than 0.60, |ΔEc| between the well layer 67 and the barrier layers 66 can be increased while |ΔEv| remains small, as compared with the semiconductor laser device using InGaP for the barrier layers. Therefore, in particular, the overflow of electrons is suppressed, so that good device characteristics such as lower threshold current, higher differential efficiency and high temperature characteristics are obtained. Furthermore, even in the case where InGaAsP with In added thereto is used for the barrier layers, P mole fractions smaller than 0.75 allow |ΔEc| between the well layer and the barrier layer to be increased while |ΔEv| remains small, as can be seen from FIGS. 5 and 6, so that successful device characteristics can be obtained. Also, in this embodiment, the InGaAsP well layer 67 is increased in the In mole fraction and the P mole fraction, as compared with the second embodiment so as to increase |ΔEc| between the well layer 67 and the barrier layer 66.

In this embodiment, the guide layers 64, 68 are formed of InGaP, and as seen from FIG. 14, the $GaAs_{0.75}P_{0.25}$ barrier layers 66 serve as barriers between the well layer 67 and the guide layers 64, 68 on the conduction band side. In this case, setting the thickness of $GaAs_{0.75}P_{0.25}$ barrier layers 66 as thin as 4 nm or less causes the threshold current to increase, the differential efficiency to decrease, and the temperature characteristic to decrease. This may be because electrons tunneling through the barrier layers 66 increase so as to overflow to the guide layers 64, 68 with the result that electrons are not accumulated enough in the well layer 67. Also, setting the thickness of the GaAsP barrier layers 66 as thick as 20 nm or more causes the electron injection efficiency to decrease, so that the threshold current increases and the differential efficiency decreases. From these and other reasons, by setting the thickness of the barrier layers 66 larger than 4 nm and smaller than 20 nm, electrons can be accumulated enough in the well layer 67 so that good device characteristics can be obtained.

Further, in this embodiment, InGaP is used for the guide layers 64, 68 and AlGaInP is used for the clad layers 63, 69. In the case where the clad layers are formed of AlGaAs, since |ΔEv0| of the barrier layers of InGaP is larger than that of the clad layers, as shown in FIGS. 2A and 2B, the injection of holes into the well layer is blocked. In contrast, in this fifth embodiment, since AlGaInP whose |ΔEv0| is larger than that of InGaP is used for the clad layers 63, 69, a band structure results in which |ΔEV0| of the clad layers 63, 69 is larger than that of the guide layers 64, 68 formed of InGaP, as shown in FIG. 14, thus allowing the injection of holes into the well layer 67 to be implemented without any problem. Further, in this band structure, Al is contained neither in the well layer 67 and the barrier layers 66a, 66b adjacent thereto, nor in the InGaP guide layers 64, 68 placed outside the barrier layers 66a, 66b. Therefore, high reliability can be obtained even during high-temperature, high-power operations.

The above-described advantages of hole-injection effect to the well layer 67 and high-reliability at a high temperature and high power state can be obtained similarly even when InGaAsP is used for the guide layers and InGaP is used for the clad layers.

Also, in this embodiment, since the InGaAsP well layer 67 is given a compressive strain of 0.35%, a semiconductor laser device whose polarization mode is TE mode can be obtained.

In this embodiment, the active region is provided by the combined InGaAsP compressive-strained well layer and GaAsP tensile-strained barrier layers. However, the active region is not limited to this combination. It is also possible to adopt a combination of InGaAsP strain-free well layer and GaAsP barrier layers, a combination of InGaAsP strain-free well layer and InGaAsP tensile-strained barrier layers, or a combination of InGaAsP compressive-strained well layer and InGaAsP tensile-strained barrier layers. Further, although the number of well layers in this embodiment is one, this is not limitative and similar effects can be obtained with any arbitrary number of well layers. Furthermore, although this embodiment has been provided in a ridge waveguide structure, this is not limitative and similar effects can be obtained with any structure such as a buried ridge structure, an internal stripe structure, a buried heterostructure, etc.

Still also, although an n-type substrate has been used as the substrate in this embodiment, similar effects can be obtained even if a p-type substrate is used and moreover the n-type and p-type of the individual layers are reversed. Further, although a wavelength of 780 nm has been adopted, this is not limitative and similar effects can be obtained only if the wavelength falls within a so-called 780 nm band which covers a range of larger than 760 nm and smaller than 800 nm.

Sixth Embodiment

Figure 15:
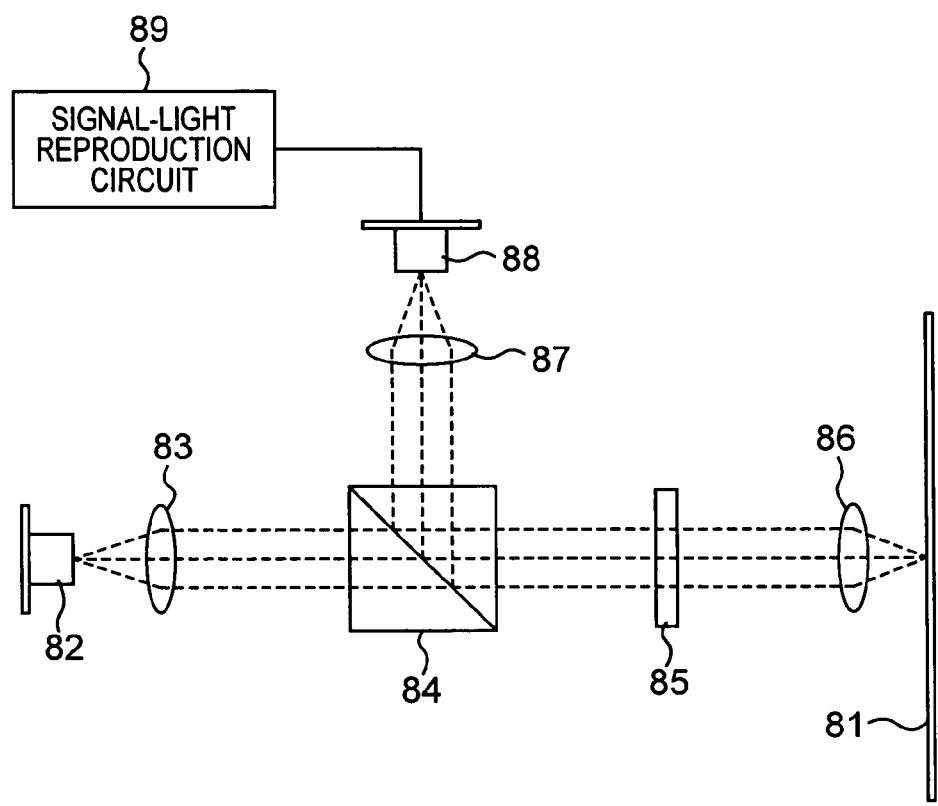
FIG. 15 is a structural view of an optical disk unit according to the present invention.
Figure 16:
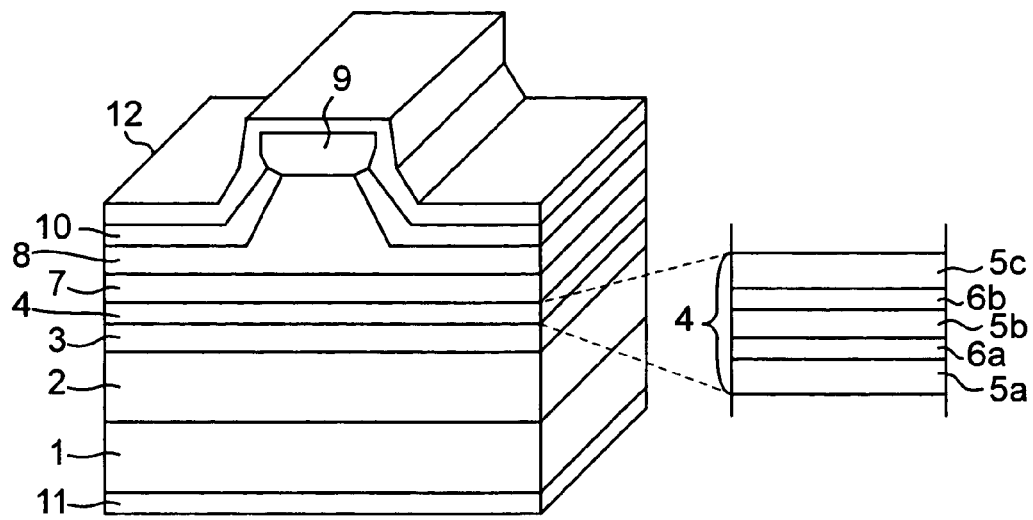
FIG. 16 shows the structure of an InGaAsP quantum well semiconductor laser device in which no Al is contained in the well layers and barrier layers.
Figure 17:
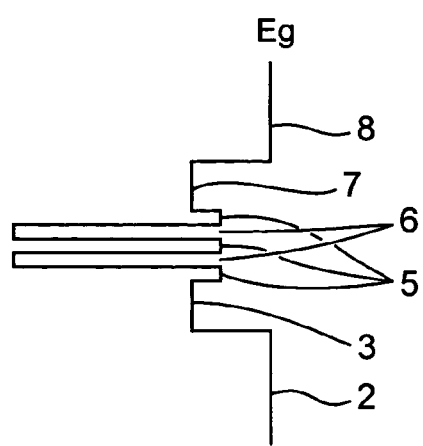
FIG. 17 shows an energy band gap (Eg) of the active region and its vicinity in the semiconductor laser device shown in FIG. 16.

This embodiment relates to an optical disk unit using the semiconductor laser device according to any one of the foregoing embodiments. FIG. 15 is a structural view of the optical disk unit of this embodiment. This optical disk unit operates to write data on an optical disk 81 or reproduce data written on the optical disk 81. In this optical disk unit, a semiconductor laser device 82 according to any one of the foregoing individual embodiments is included as a light-emitting device for use in those operations.

The configuration and operations of this optical disk unit will be described below. In this optical disk unit, for write operations, signal light (a laser beam with a data signal superimposed thereon) emitted from the semiconductor laser device 82 passes through a collimator lens 83, becoming parallel light, and is transmitted by a beam splitter 84. Then, after its polarized state is adjusted by a λ/4 polarizer 85, the signal light is converged by a laser-beam irradiation objective lens 86 to thereby irradiate the optical disk 81. In this way, by the laser beam with a data signal superimposed thereon, data is written onto the optical disk 81.

For read operations, a laser beam emitted from the semiconductor laser device 82 with no data signal superimposed on the laser beam travels along the same path as in the write operation, irradiating the optical disk 81. Then, the laser beam reflected by the surface of the optical disk 81, on which data has been recorded, passes through the laser-beam irradiation objective lens 86 and the λ/4 polarizer 85, and is thereafter reflected by the beam splitter 84 so as for its traveling direction to be changed by 90°. Subsequently, the laser beam is focused by a reproduction-light objective lens 87 and applied to a signal-detection use photodetector device 88. Then, in the signal-detection use photodetector device 88, a data signal read from the optical disk 81 is transformed into an electric signal according to the intensity of the incident laser beam, and reproduced to the original information signal by a signal-light reproduction circuit 89.

The optical disk unit of this embodiment employs the semiconductor laser device 82, as described above, which operates with higher optical power than conventional. Therefore, data read-and-write operations are implementable even if the rotational speed of the optical disk 81 is enhanced higher than conventional. Accordingly, the access time to optical disks, which has hitherto mattered in write operations particularly to CD-Rs, CD-RWs or the like, can be reduced to a large extent. This makes it feasible to provide an optical disk unit which realizes more comfortable operations.

This embodiment has been described on a case where the semiconductor laser device according to any of the foregoing embodiments is applied to a recording and playback type optical disk unit. However, this invention is not limited to this, and needless to say, applicable also to optical-disk recording units or optical-disk playback units in which a semiconductor laser device of the 780 nm wavelength band is used as a light-emitting device.

Also, in the first through fifth embodiments, use is made of a structure in which an active region having a well layer or layers sandwiched between corresponding barrier layers is further sandwiched between AlGaAs guide layers. However, the present invention is not limited to this. It is also possible, for example, that the active region is of a structure that a thin layer of AlGaAs is provided within the barrier layers itself.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device having an oscillation wavelength of larger than 760 nm and smaller than 800 nm in which at least a lower clad layer, a lower guide layer, an active region, an upper guide layer and an upper clad layer are supported by a GaAs substrate, the active region having a quantum well structure in which one or more well layers and barrier layers are stacked, wherein said one or more well layers are formed of InGaAsP and said barrier layers are formed of InGaAsP, the barrier layers having a band gap energy larger than that of said one or more well layers, said upper and/or lower guide layer is formed of $Al_zGa_{1-z}$As $(0.20<z\leq1)$, said one or more well layers are compressive strained and said barrier layers are tensile strained, each of the $Al_zGa_{1-z}$As upper and/or lower guide layers interfaces with an adjacent tensile strained barrier layer, upper and lower surfaces of each of the one or more well layers interfaces with an adjacent tensile strained barrier layer, said semiconductor laser device further comprises a GaAs etching stop layer, and said upper clad layer comprises an AlGaAs first upper clad layer and an AlGaAs second upper clad layer with the GaAs etching stop layer therebetween, said AlGaAs second upper clad layer defining a ridge stripe.

2. The semiconductor laser device according to claim 1, wherein
a value of z representing a mole fraction of Al in the group-III elements of said upper and/or lower guide layer is larger than 0.25.

3. The semiconductor laser device according to claim 1, wherein
said upper and lower clad layers contain Al, and
a value of z, where a value of z represents a mole fraction of Al in the group-III elements of said upper and/or lower guide layer, is smaller than a value of an Al mole fraction of said upper and lower clad layers.

4. The semiconductor laser device according to claim 3, wherein
the value of z varies stepwise or continuously and in such a fashion as to increase with increasing nearness to said upper and lower clad layers.

5. The semiconductor laser device according to claim 1, wherein
a value of z, where a value of z represents a mole fraction of Al in the group-III elements of said upper and/or lower guide layer, of at least a portion in contact with a barrier layer of said upper and/or lower guide layer is smaller than 0.4.

6. An optical disk unit in which the semiconductor laser device as defined in claim 1 is used as a light-emitting device.

7. A semiconductor laser device having an oscillation wavelength of larger than 760 nm and smaller than 800 nm in which at least a lower clad layer, an active region and an upper clad layer are supported by a GaAs substrate, the active region having a quantum well structure in which one or more well layers and barrier layers are stacked, wherein
said barrier layers are formed of an $In_{1-x}Ga_xAs_{1-y}P_y$, having a band gap energy larger than that of said well layers, and there hold relationships that $0 < x \leq 1$, $0.2 < y < 0.75$, and $|(a2-a1)/a1| \times 100 > 0.65$, where a1 is a lattice constant of said one or more well layers, and a2 is a lattice constant of said barrier layers.

8. The semiconductor laser device according to claim 7, wherein given that a lattice constant of the GaAs substrate is a0, a value of (a1−a0)/a0 is a positive value.

9. The semiconductor laser device according to claim 7, wherein no Al element is contained in said one or more well layers.

10. The semiconductor laser device according to claim 9, wherein said one or more well layers are formed of InGaAsP.

11. The semiconductor laser device according to claim 7, wherein any or every one of said barrier layers is in contact with an AlGaAs layer at a surface of the barrier layer opposite from a well layer.

12. The semiconductor laser device according to claim 11, wherein the barrier layer in contact with the AlGaAs layer is an outermost layer in said active region.

13. The semiconductor laser device according to claim 11, wherein a layer thickness of the barrier layer in contact with the AlGaAs layer is larger than 4 nm.

14. The semiconductor laser device according to claim 7, wherein a value of x representing a mole fraction of Ga in the group-III elements of said barrier layers is smaller than 1.

15. The semiconductor laser device according to claim 7, further comprising:
a guide layer formed of AlGaAs and placed between said active region and said upper and/or lower clad layer.

16. The semiconductor laser device according to claim 7, wherein said upper and/or lower clad layer is formed of AlGaAs.

17. The semiconductor laser device according to claim 7, further comprising:
a guide layer formed of InGaP or InGaAsP and placed between said active region and said upper and/or lower clad layer, wherein said upper and/or lower clad layer is formed of AlGaInP or InGaP.

18. The semiconductor laser device according to claim 7, wherein a value of y representing a mole fraction of P in the group-V elements of said barrier layers is larger than 0.25.

19. The semiconductor laser device according to claim 7, wherein a value of y representing a mole fraction of P in the group-V elements of said barrier layers is smaller than 0.6.

20. An optical disk unit in which the semiconductor laser device as defined in claim 7 is used as a light-emitting device.

21. The semiconductor laser device according to claim 1, further comprising:
a GaAs protective layer on top of the AlGaAs second upper clad layer;
a current block layer provided along the GaAs etching stop layer on opposite sides of the AlGaAs second upper clad layer and along each of opposite side surfaces of the AlGaAs second upper clad layer and the GaAs protective layer so as to sandwich the AlGaAs second upper clad layer and the GaAs protective layer therebetween;
a GaAs buried protective layer provided on the opposite sides of the GaAs protective layer, with a part of the current block layer disposed between the GaAs protective layer and the GaAs buried protective layer, and with top surfaces of the GaAs protective layer, the GaAs buried protective layer, and the part of the current block layer being flush with each other; and
a GaAs cap layer provided on the top surfaces of the GaAs protective layer, the part of the current block layer, and the GaAs buried protective layer.

22. The semiconductor laser device according to claim 21, wherein the current block layer comprises an AlGaAs first current block layer and a GaAs second current block layer laid on the AlGaAs first current block layer.

* * * * *